(12) United States Patent
Kim

(10) Patent No.: US 11,552,047 B2
(45) Date of Patent: Jan. 10, 2023

(54) SEMICONDUCTOR PACKAGE INCLUDING PLURALITY OF SEMICONDUCTOR CHIPS AND METHOD FOR MANUFACTURING THE SAME

(71) Applicant: Samsung Electronics Co., Ltd., Suwon-si (KR)

(72) Inventor: Hakmin Kim, Cheongju-si (KR)

(73) Assignee: Samsung Electronics Co., Ltd.

( * ) Notice: Subject to any disclaimer, the term of this patent is extended or adjusted under 35 U.S.C. 154(b) by 26 days.

(21) Appl. No.: 17/360,173

(22) Filed: Jun. 28, 2021

(65) Prior Publication Data
US 2022/0189909 A1 Jun. 16, 2022

(30) Foreign Application Priority Data
Dec. 15, 2020 (KR) .......... 10-2020-0174958

(51) Int. Cl.
*H01L 23/00* (2006.01)
*H01L 25/00* (2006.01)
*H01L 21/78* (2006.01)
*H01L 25/065* (2006.01)

(52) U.S. Cl.
CPC .............. *H01L 24/83* (2013.01); *H01L 21/78* (2013.01); *H01L 25/0652* (2013.01); *H01L 25/50* (2013.01); *H01L 2224/8385* (2013.01); *H01L 2225/06562* (2013.01)

(58) Field of Classification Search
CPC ...... H01L 24/83; H01L 21/78; H01L 25/0652
See application file for complete search history.

(56) References Cited

U.S. PATENT DOCUMENTS

| | | | |
|---|---|---|---|
| 2004/0050571 A1 | 3/2004 | Kim et al. | |
| 2006/0267173 A1 | 11/2006 | Takiar et al. | |
| 2009/0072332 A1* | 3/2009 | Dekker | B01L 3/502715 438/49 |
| 2009/0166839 A1 | 7/2009 | Suzuki et al. | |
| 2010/0148209 A1* | 6/2010 | Hatano | H01L 27/3262 257/E33.053 |
| 2011/0062596 A1 | 3/2011 | Murayama et al. | |
| 2012/0119385 A1* | 5/2012 | Co | H01L 24/24 257/E23.141 |
| 2013/0062782 A1 | 3/2013 | Yoshimura et al. | |
| 2013/0078763 A1 | 3/2013 | Lee et al. | |
| 2013/0087823 A1* | 4/2013 | Tsai | H01L 33/62 257/98 |

(Continued)

*Primary Examiner* — Thao P Le
(74) *Attorney, Agent, or Firm* — Myers Bigel, P.A.

(57) ABSTRACT

A semiconductor package manufacturing method of the disclosure includes providing a multilayer adhesive film, forming a notch and a plurality of openings extending through the multilayer adhesive film, attaching the multilayer adhesive film to a back side of a wafer to form a stack, separating the stack into a plurality of individual stacks, separating each of the plurality of individual stacks into an upper stack and a lower stack, providing a substrate on which a first semiconductor chip is mounted, and stacking the upper stack on the first semiconductor chip. The upper stack includes a second semiconductor chip and a die attach pattern covering a portion of a back surface of the second semiconductor chip. A first side surface of the die attach pattern is aligned with a first side surface of the first semiconductor chip.

20 Claims, 18 Drawing Sheets

(56) References Cited

U.S. PATENT DOCUMENTS

| | | | | |
|---|---|---|---|---|
| 2013/0264722 | A1* | 10/2013 | Okada | H01L 24/97 |
| | | | | 257/777 |
| 2014/0072774 | A1* | 3/2014 | Kito | H01L 21/68735 |
| | | | | 156/196 |
| 2014/0237815 | A1* | 8/2014 | Lau | H05K 3/0008 |
| | | | | 29/829 |
| 2015/0123290 | A1* | 5/2015 | Kim | H01L 25/105 |
| | | | | 257/777 |
| 2016/0211205 | A1* | 7/2016 | Nagatomo | H01L 23/49827 |
| 2019/0067250 | A1* | 2/2019 | Tojo | H01L 21/78 |
| 2019/0088550 | A1* | 3/2019 | Ganitzer | H01L 24/05 |
| 2021/0066547 | A1* | 3/2021 | Doan | H01L 33/0095 |
| 2022/0189909 | A1* | 6/2022 | Kim | H01L 25/0652 |
| 2022/0271000 | A1* | 8/2022 | Zuo | H01L 24/27 |

* cited by examiner (a)  (b)

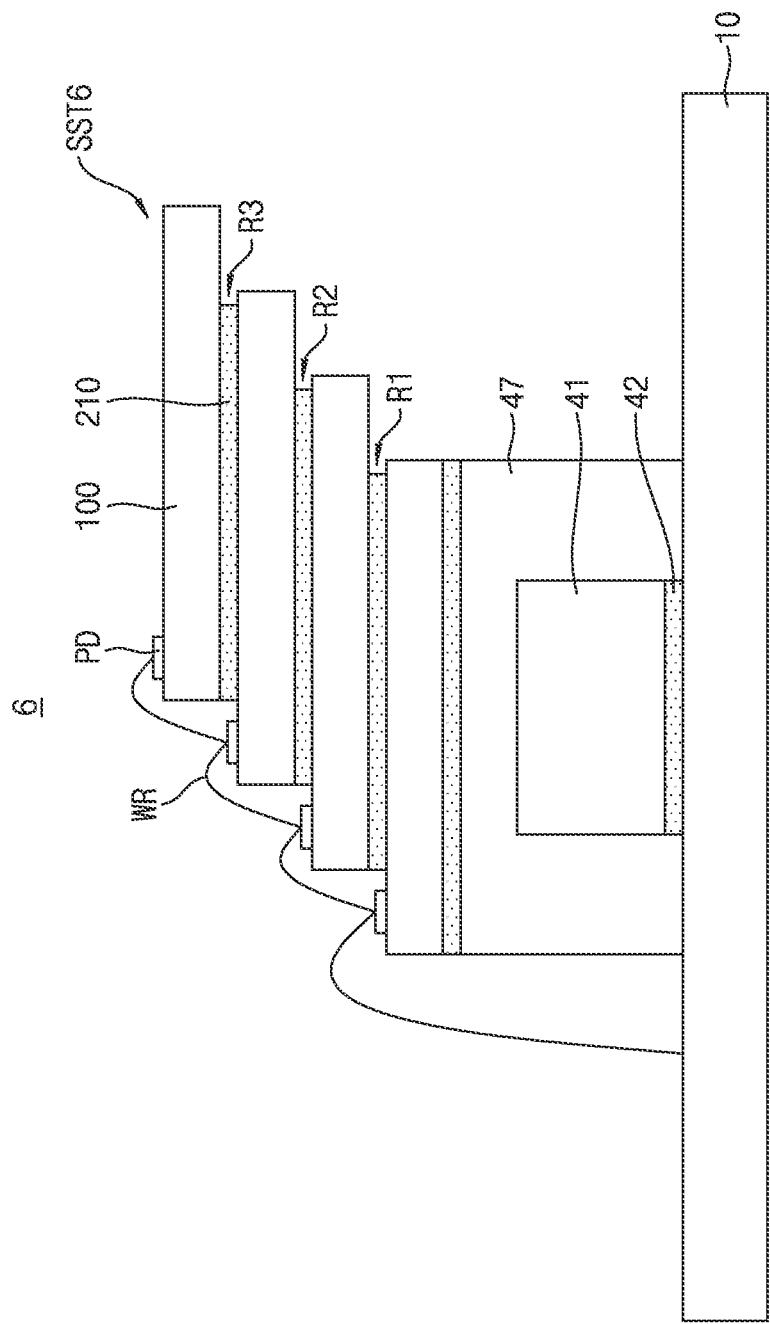

SEMICONDUCTOR PACKAGE INCLUDING PLURALITY OF SEMICONDUCTOR CHIPS AND METHOD FOR MANUFACTURING THE SAME

CROSS-REFERENCE TO THE RELATED APPLICATION

This application claims priority from Korean Patent Application No. 10-2020-0174958, filed on Dec. 15, 2020, in the Korean Intellectual Property Office, the disclosure of which is incorporated herein by reference in its entirety.

BACKGROUND

The example embodiments of the disclosure relate to a semiconductor package including a plurality of semiconductor chips stacked in a cascade structure and a method for manufacturing the same.

A semiconductor package may include a semiconductor stack including a plurality of semiconductor chips stacked on a substrate in a cascade structure, and a logic chip disposed adjacent to the semiconductor stack, to function as a controller for the plurality of semiconductor chips. The logic chip may be connected to the substrate at a position adjacent to the semiconductor stack having the cascade structure through wire bonding. The plurality of semiconductor chips may be stacked using an adhesive film. A pressure may be applied to the plurality of semiconductor chips stacked in a cascade structure in a molding process, etc. and, as such, the plurality of semiconductor chips may be likely to be inclined in one direction. When the semiconductor chips are inclined, a wire connected to the logic chip and an exposed adhesive film may be attached to each other. When the adhesive film is attached to the wire, the inclined semiconductor chips cannot be returned to original states thereof and, as such, cracks may be generated in the semiconductor chips.

SUMMARY

The example embodiments of the disclosure provide a semiconductor package including a plurality of semiconductor chips stacked in a cascade structure while including a die attach pattern exposing portions of back surfaces of the semiconductor chips.

The example embodiments of the disclosure provide a semiconductor package manufacturing method in which a plurality of semiconductor chips is stacked in a cascade structure, and a die attach pattern is attached to cover only portions of back surfaces of the semiconductor chips such that other portions of the back surfaces of the semiconductor chips are exposed.

A method for manufacturing a semiconductor package in accordance with an example embodiment of the disclosure may include providing a multilayer adhesive film, forming a notch and a plurality of openings extending through the multilayer adhesive film. attaching the multilayer adhesive film to a back side of a wafer to form a stack, separating the stack into a plurality of individual stacks, separating each of the plurality of individual stacks into an upper stack and a lower stack, providing a substrate on which a first semiconductor chip is mounted, and stacking the upper stack on the first semiconductor chip. The upper stack may include a second semiconductor chip and a die attach pattern covering a portion of a back surface of the second semiconductor chip. A first side surface of the die attach pattern may be aligned with a first side surface of the first semiconductor chip.

A method for manufacturing a semiconductor package in accordance with an example embodiment of the disclosure may include providing a wafer including a front surface comprising a circuit layer and a back surface opposite the front surface, forming a protective film on the front surface of the wafer, providing a multilayer adhesive film including a die attach film, forming a plurality of bar-shaped or elongated openings extending through the multilayer adhesive film, removing the protective film to expose the front surface of the wafer, attaching the die attach film to the back surface of the wafer to form a stack, separating the stack into a plurality of individual stacks, separating each of the plurality of individual stacks into an upper stack and a lower stack, the upper stack including a first semiconductor chip, and a die attach pattern covering a portion of a back surface of the first semiconductor chip, providing a substrate on which a second semiconductor chip is mounted, and stacking the upper stack on the second semiconductor chip. A first side surface of the die attach pattern may be vertically misaligned from a first side surface of the first semiconductor chip while being vertically misaligned from a first side surface of the second semiconductor chip, and the first side surfaces of the first semiconductor chip and the second semiconductor chip may be disposed adjacent the first side surface of the die attach pattern.

A method for manufacturing a semiconductor package in accordance with an example embodiment of the disclosure may include providing a wafer including a front surface including a scribe lane and a back surface opposite the front surface, forming a protective film on the front surface of the wafer, providing a multilayer adhesive film including a die attach film, a cover layer covering a lower surface of the die attach film, a photosensitive adhesive (PSA) layer covering an upper surface of the die attach film, and a base layer covering an upper surface of the PSA layer, forming a notch and a plurality of bar-shaped openings extending through the multilayer adhesive film, removing the protective film to expose the front surface of the wafer, removing the cover layer from the multilayer adhesive film, and attaching the die attach film to the back surface of the wafer to form a stack, separating the stack into a plurality of individual stacks, separating each of the plurality of individual stacks into an upper stack and a lower stack, the upper stack including a semiconductor chip and a die attach pattern covering a portion of a back surface of the semiconductor chip, and stacking the upper stack on a substrate. In the stack, the openings may be vertically aligned with portions of the scribe lane. A width of each of the openings may be 1 to 10% of a width of the semiconductor chip.

BRIEF DESCRIPTION OF THE DRAWINGS

FIG. 27 is a sectional view of a semiconductor package according to an example embodiment of the disclosure.

DETAILED DESCRIPTION

Figure 1:
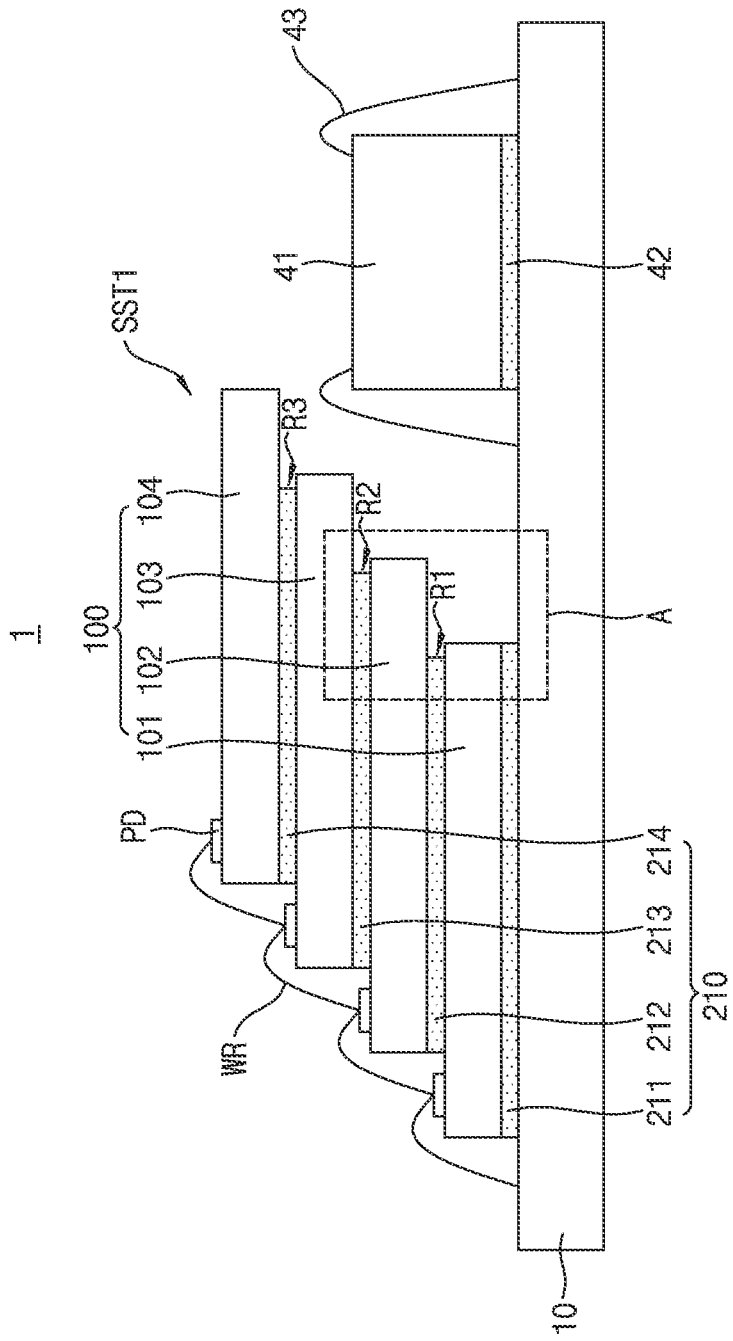
FIG. 1 is a sectional view of a semiconductor package according to an example embodiment of the disclosure.
Figure 2:
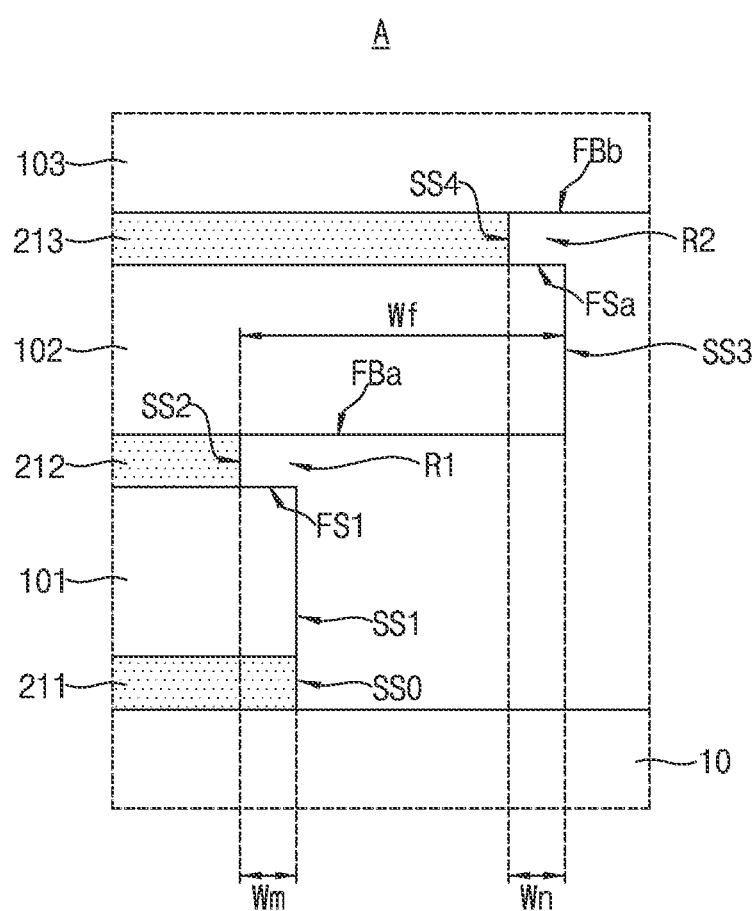
FIG. 2 is an enlarged view of a portion A of FIG. 1.

FIG. 1 is a sectional view of a semiconductor package according to an example embodiment of the disclosure. FIG. 2 is an enlarged view of a portion A of FIG. 1.

Referring to FIG. 1, a semiconductor package 1 may include a substrate 10, a semiconductor stack SST1 disposed on the substrate 10, and a semiconductor chip 41 disposed on the substrate 10 while being spaced apart from the semiconductor stack SST1.

The substrate 10 may be a printed circuit board (PCB). The printed circuit board may be a multilayer circuit board having vias and various circuits therein. For example, the substrate 10 may be a rigid printed circuit board, a flexible printed circuit board, or a rigid-flexible printed circuit board.

The semiconductor stack SST1 may include a plurality of semiconductor chips 100. For example, the semiconductor stack SST1 may include four semiconductor chips 101, 102, 103 and 104 as shown in the drawing. Of course, example embodiments of the disclosure are not limited to the above-described condition. The semiconductor stack SST1 may include more or less than 4 semiconductor chips. The semiconductor chips 100 may have an edge pad structure in which a pad PD is provided only at an edge of each semiconductor chip at one side of the semiconductor chip. For example, each of the semiconductor chips 100 may include a front surface and a back surface, and a pad PD may be provided on one-side edge of the front surface (a left edge in the drawing). The pad PD may be electrically connected to an internal integrated circuit of the semiconductor chip 100. Here, the front surface of the semiconductor chip 100 is one surface of the semiconductor chip 100 provided with various circuit layers, and may not face the substrate 10. The back surface of the semiconductor chip 100 is a surface of the semiconductor chip 100 opposite to the front surface, and may face the substrate 10.

The semiconductor chips 100 may be stacked in a stepped structure. The semiconductor chips may be stacked in a stepped manner such that the pads PD at the front surfaces thereof are exposed. For example, the semiconductor chips 100 may be stacked in the form of a cascade ascending in a right direction (or descending in a left direction) such that the pad PD of each semiconductor chip 100 is exposed without being covered by the semiconductor chip 100 disposed just above the former semiconductor chip 100. The exposed pad PD may be electrically connected to the substrate 10 through a wire WR.

The semiconductor stack SST1 may include a plurality of die attach patterns 210 disposed between the substrate 10 and the semiconductor chip 101 and between vertically adjacent ones of the semiconductor chips 102, 103 and 104. For example, the plurality of die attach patterns 210 may include four die attach patterns 211, 212, 213 and 214, as shown in the drawing. Of course, example embodiments of the disclosure are not limited to the above-described condition, and the number of the die attach patterns 210 may be varied in accordance with the number of the stacked semiconductor chips 100. The semiconductor chips 100 may be sequentially attached to the substrate 10 above the substrate 10. For example, each of the die attach patterns 210 may include an adhesive film such as a direct adhesive film (DAF). The DAF may be an ultrathin adhesive film used to interconnect a semiconductor chip and a circuit board or to interconnect semiconductor chips in a semiconductor package process. The DAF may include a component of a bonding agent or an adhesive. For example, the DAF may include at least one of epoxy, polyimide, acryl and polyimide. The DAF may include at least one of acryl, vinyl acetate, an ethylene-vinyl acetate copolymer, an ethylene-acrylic acid ester copolymer, polyamide, polyethylene, polysulfone, epoxy, polyimide, a polyamide acid, a silicone phenol rubber polymer, a fluororubber polymer, a fluororesin, etc.

In an embodiment, the semiconductor chips 100 may include first to fourth semiconductor chips 101, 102, 103 and 104. The die attach patterns 210 may include first to fourth die attach patterns 211, 212, 213 and 214. The first semiconductor chip 101 may be disposed closest or nearest to the substrate 10. The first semiconductor chip 101 may be attached to the substrate 10 through the first die attach pattern 211.

The semiconductor chip 102 may be disposed on the first semiconductor chip 101. The second semiconductor chip 102 may be disposed in a state of being offset (e.g., horizontally offset) with respect to the first semiconductor chip 101, to expose the pad PD of the first semiconductor chip 101. The second die attach pattern 212 may be interposed between the first semiconductor chip 101 and the second semiconductor chip 102. The second semiconductor chip 102 may be attached to the first semiconductor chip 101 through the second die attach pattern 212.

The third semiconductor chip 103 may be attached to the second semiconductor chip 102 through the third die attach pattern 213 above the second semiconductor chip 102 in the same manner as the manner in which the second semiconductor chip 102 is attached to the first semiconductor chip 101. The fourth semiconductor chip 104 may be attached to the third semiconductor chip 103 through the fourth die attach pattern 214 above the third semiconductor chip 103 in the same manner as described above.

The semiconductor chip 41 may be mounted on the substrate 10 while being spaced apart from the semiconductor stack SST1. The semiconductor chip 41 may be disposed at a right side of the semiconductor stack SST1. The semiconductor chip 41 may be attached to the upper surface of the substrate 10 using an adhesive member 42. For example, the adhesive member 42 may be an adhesive film such as a direct adhesive film (DAF). The semiconductor chip 41 may include an integrated circuit. For example, the semiconductor chip 41 may be a logic chip including a logic circuit. The logic chip may be a controller configured to control memory chips. The semiconductor chip 41 may be wire-bonded to the substrate 10 through a wire 43. In an embodiment, at least a portion of the wire 43 may be disposed below the semiconductor stack SST1. For example, the wire 43 may vertically overlap with or be vertically aligned with the fourth semiconductor chip 104.

In an embodiment, one side surface (e.g., a first side surface) of at least one of the second to fourth die attach patterns 212, 213 and 214 may be vertically misaligned from or horizontally offset from one side surface (e.g., a first side surface) of at least one of the semiconductor chips 101, 102 and 103 disposed just under the at least one of the second to fourth die attach patterns 212, 213 and 214. For example, one side surface of each of the second to fourth die attach patterns 212, 213 and 214 may be vertically misaligned from one side surface of a corresponding one of the first to third semiconductor chips 101, 102 and 103. As such, a portion of the front surface of each of the first to third semiconductor chips 101, 102 and 103 may be exposed without being covered by a corresponding one of the second to fourth die attach pattern 212, 213 and 214. In this case, the exposed portion of the front surface of each of the first to third semiconductor chips 101, 102 and 103 may be adjacent to an edge (e.g., a first edge) of the front surface opposite to an edge (e.g., a second edge) of the front surface at which the pad PD is disposed.

Referring to FIGS. 1 and 2, the first die attach pattern 211 may completely cover the back surface (the surface opposite to the front surface) of the first semiconductor chip 101. One side surface (e.g., a first side surface) SS0 of the first die attach pattern 211 may be vertically aligned with one side surface (e.g., a first side surface) SS1 of the first semiconductor chip 101.

In an embodiment, one side surface (e.g., a first side surface) SS2 of the second die attach pattern 212 may be offset (e.g., horizontally offset) from one side surface SS1 of the first semiconductor chip 101 and one side surface (e.g., a first side surface) SS3 of the second semiconductor chip 102. Here, when viewed in a cross-sectional view, one side surface SS2 of the second die attach pattern 212 may be a side surface disposed farthest from the pads PD of the semiconductor chips 100 from among side surfaces of the second die attach pattern 212. When viewed in a cross-sectional view, one side surface SS1 of the first semiconductor chip 101 may be a side surface nearest to one surface SS2 of the second die attach pattern 212 from among side surfaces of the first semiconductor chip 101. In addition, when viewed in a cross-sectional view, one side surface SS3 of the second semiconductor chip 102 may be a side surface nearest to one side surface SS2 of the second die attach pattern 212 from among the side surfaces of the second semiconductor chip 102.

One side surface SS2 of the second die attach pattern 212 may be vertically misaligned from or horizontally offset from one side surface SS1 of the first semiconductor chip 101. One side surface SS2 of the second die attach pattern 212 may be disposed inwards of one side surface SS1 of the first semiconductor chip 101. As such, the second die attach pattern 212 may expose a portion of a back surface FBa of the second semiconductor chip 102 without covering the portion of the back surface FBa, and may expose a portion of a front surface FS1 of the first semiconductor chip 101 without covering the portion of the front surface FS1. A width Wf of the exposed portion of the back surface FBa of the second semiconductor chip 102 may be 1 to 10% of the width of the second semiconductor chip 102. For example, the width Wf of the exposed portion of the back surface FBa of the second semiconductor chip 102 may be about 200 to 800 For example, a width Wm of the exposed portion of the front surface FS1 of the first semiconductor chip 101 may be about 25 μm or less. In an embodiment, a first recess R1 may be defined by the exposed portion of the front surface FS1 of the first semiconductor chip 101, one side surface SS2 of the second die attach pattern 212 and the exposed portion of the back surface FBa of the second semiconductor chip 102. The first recess R1 may be formed to be concave or recessed inwards of the second die attach pattern 212 between the first semiconductor chip 101 and the second semiconductor chip 102.

In an embodiment, one side surface SS4 (e.g., a first side surface) of the third die attach pattern 213 may be offset (e.g., horizontally offset) from one side surface SS3 of the second semiconductor chip 102 and one side surface of the third semiconductor chip 103 (cf. FIG. 1). Here, when viewed in a cross-sectional view, one side surface SS4 of the third die attach pattern 213 may be a side surface disposed farthest from the pads PD of the semiconductor chips 100 from among side surfaces of the third die attach pattern 213. When viewed in a cross-sectional view, one side surface SS3 of the second semiconductor chip 102 may be a side surface nearest to one side surface SS4 of the third die attach pattern 213 from among the side surfaces of the second semiconductor chip 102. In addition, when viewed in a cross-sectional view, one side surface (e.g., a first side surface) of the third semiconductor chip 103 may be a side surface nearest to one side surface SS4 of the third die attach pattern 213 from among the side surfaces of the third semiconductor chip 103.

One side surface SS4 of the third die attach pattern 213 may be vertically misaligned from or unaligned with one side surface SS3 of the second semiconductor chip 102. One side surface SS4 of the third die attach pattern 213 may be disposed inwards of one side surface SS3 of the second semiconductor chip 102. As such, the third die attach pattern 213 may expose a portion of a back surface FBb of the third semiconductor chip 103 without covering the portion of the back surface FBb, and may expose a portion of a front surface FSa of the second semiconductor chip 102 without covering the portion of the front surface FSa. A width of the exposed portion of the back surface FBb of the third semiconductor chip 103 may be 1 to 10% of the width of the third semiconductor chip 103. For example, the width of the exposed portion of the back surface FBb of the third semiconductor chip 103 may be about 200 to 800 μm. For example, a width Wn of the exposed portion of the front surface FSa of the second semiconductor chip 102 may be about 25 μm or less. The width Wn of the exposed portion of the front surface FSa of the second semiconductor chip 102 may be substantially equal to the width Wm of the exposed portion of the front surface FS1 of the first semiconductor chip 101. In an embodiment, the width Wn of the exposed portion of the front surface FSa of the second semiconductor chip 102 may differ from the width Wm of the exposed portion of the front surface FS1 of the first semiconductor chip 101. In an embodiment, a second recess R2 may be defined by the exposed portion of the front surface FSa of the second semiconductor chip 102, one side surface SS4 of the third die attach pattern 213 and the exposed portion of the back surface FBb of the third semiconductor chip 103. The second recess R2 may be formed to be concave or recessed inwards of the third die attach pattern 213 between the second semiconductor chip 102 and the third semiconductor chip 103.

Although not shown in FIG. 2, referring to FIG. 1, the semiconductor package 1 may further include a third recess R3 defined by the third semiconductor chip 103, the fourth die attach pattern 214 and the fourth semiconductor chip 104.

Figure 3:
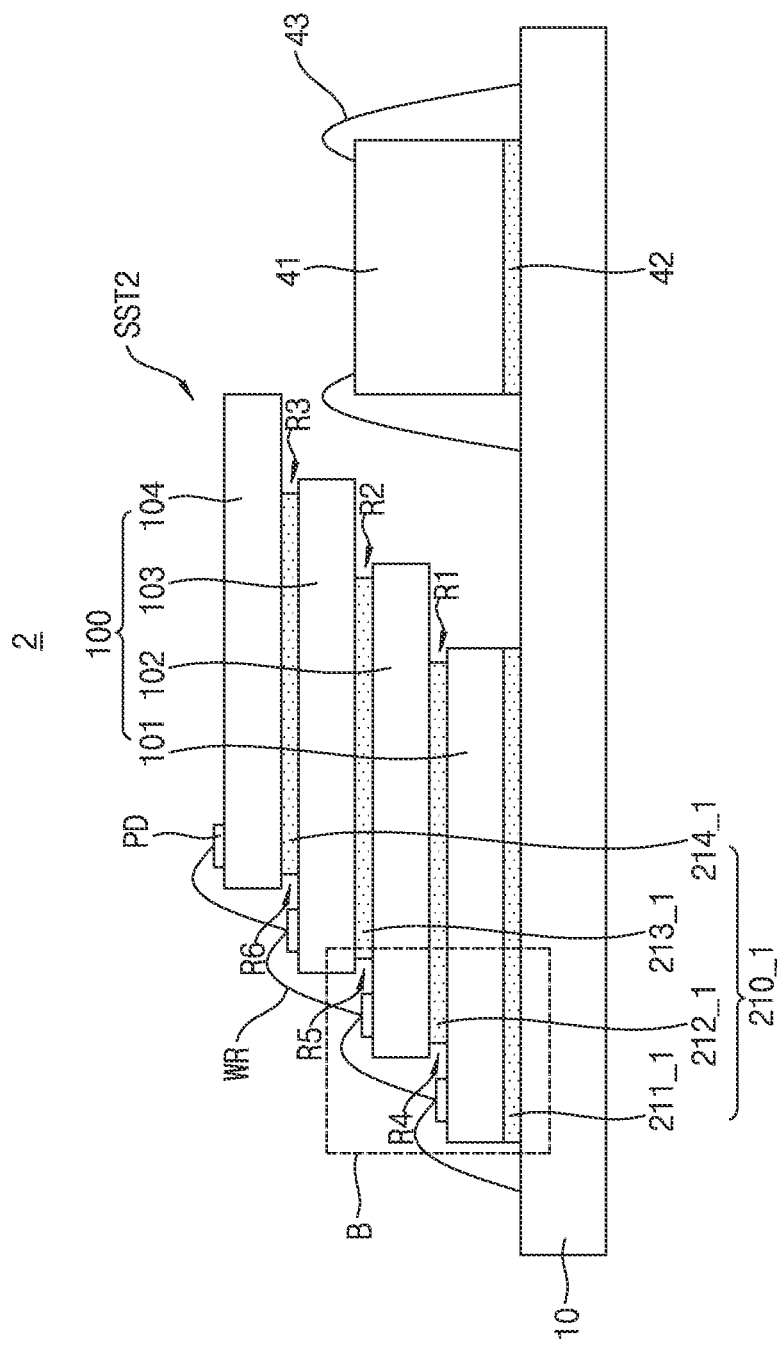
FIG. 3 is a sectional view of a semiconductor package according to an example embodiment of the disclosure.
Figure 4:
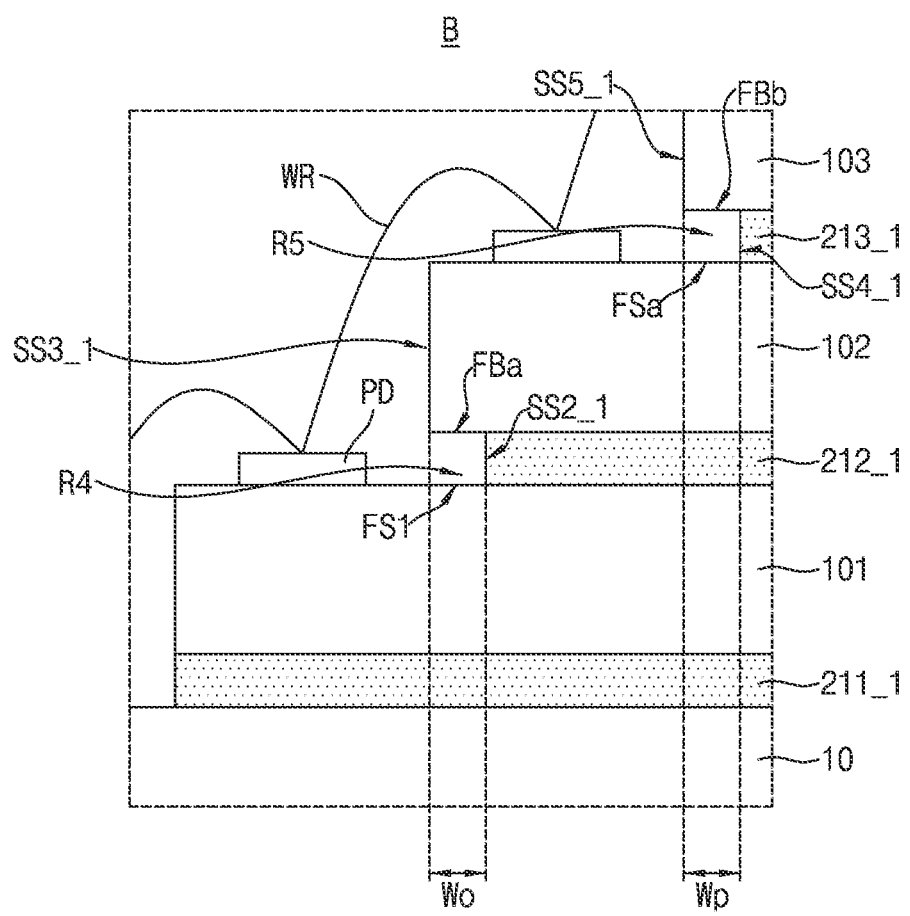
FIG. 4 is an enlarged view of a portion B of FIG. 3.

FIG. 3 is a sectional view of a semiconductor package according to an example embodiment of the disclosure. FIG. 4 is an enlarged view of a portion B of FIG. 3.

Referring to FIG. 3, a semiconductor package 2 may include a substrate 10, a semiconductor stack SST2 disposed on the substrate 10, and a semiconductor chip 41 disposed on the substrate 10 while being spaced apart from the semiconductor stack SST2. The semiconductor stack SST2 may include a plurality of semiconductor chips 100 and a plurality of die attach patterns 210_1.

In an embodiment, the semiconductor stack SST2 may include first to fourth semiconductor chips 101, 102, 103 and 104, and first to fourth die attach patterns 211_1, 212_1, 213_1 and 214_1. In the same manner as described with reference to FIGS. 1 and 2, one side surface of each of the second to fourth die attach patterns 212_1, 213_1 and 214_1 may be offset from one side surface of each of the first to third semiconductor chips 101, 102 and 103.

In an embodiment, the other side surface (e.g., a second side surface) of at least one of the second to fourth die attach patterns 212_1, 213_1 and 214_1 may be vertically misaligned from or horizontally offset from the other side surface (e.g., a second side surface) of at least one of the semiconductor chips 101, 102 and 103 disposed just under the at least one of the second to fourth die attach patterns 212_1, 213_1 and 214_1. For example, the other side surface of each of the second to fourth die attach patterns 212_1, 213_1 and 214_1 may be vertically misaligned from or unaligned with the other side surface of a corresponding one of the second to fourth semiconductor chips 102, 103 and 104. Here, the other side surface of each of the second to fourth die attach patterns 212_1, 213_1 and 214_1 may be a surface opposite to one side surface of each of the second to fourth die attach patterns 212_1, 213_1 and 214_1 (for example, "SS2" or "SS4" in FIG. 2). When viewed in a cross-sectional view, the other side surface of each of the second to fourth die attach patterns 212_1, 213_1 and 214_1 may be a side surface nearest to the pad PD of a corresponding one of the semiconductor chips 100 from among side surfaces of each of the second to fourth die attach patterns 212_1, 213_1 and 214_1. The other side surface of each of the second to fourth die attach patterns 212_1, 213_1 and 214_1 may be a surface opposite to one side surface of each of the second to fourth semiconductor chips 102, 103 and 104 (for example, "SS1" or "SS3" in FIG. 2).

Referring to FIGS. 3 and 4, in an embodiment, the other side surface SS2_1 of the second die attach pattern 212_1 may be offset (e.g., horizontally offset) from the other surface SS3_1 of the second semiconductor chip 102. That is, the other side surface SS2_1 of the second die attach pattern 212_1 may be vertically misaligned from or unaligned with the other surface SS3_1 of the second semiconductor chip 102. The other side surface SS2_1 of the second die attach pattern 212_1 may be disposed inwards of the other surface SS3_1 of the second semiconductor chip 102 and, as such, the second die attach pattern 212_1 may expose a portion of a back surface FBa of the second semiconductor chip 102 without covering the portion of the back surface FBa. For example, a width Wo of the exposed portion of the back surface FBa of the second semiconductor chip 102 may be about 25 μm or less. In an embodiment, the width Wo of the exposed portion of the back surface FBa of the second semiconductor chip 102 may be substantially equal to a width Wm (cf. FIG. 2) of an exposed portion of a front surface FS1 of the first semiconductor chip 101. In an embodiment, the width Wo of the exposed portion of the back surface FBa of the second semiconductor chip 102 may differ from the width Wm (cf. FIG. 2) of the exposed portion of the front surface FS1 of the first semiconductor chip 101. In an embodiment, a fourth recess R4 may be defined by the front surface FS1 of the first semiconductor chip 101, the other side surface SS2_1 of the second die attach pattern 212_1 and the exposed portion of the back surface FBa of the second semiconductor chip 102. The fourth recess R4 may be formed to be concave or recessed inwards of the second die attach pattern 212_1 between the first semiconductor chip 101 and the second semiconductor chip 102. The fourth recess R4 may be disposed at an opposite side of the second die attach pattern 212_1 as the first recess R1.

In an embodiment, the other side surface SS4_1 of the third die attach pattern 213_1 may be offset (e.g., horizontally offset) from the other side surface SS5_1 of the third semiconductor chip 103. That is, the other side surface SS4_1 of the third die attach pattern 213_1 may be vertically misaligned from or unaligned with the other side surface SS5_1 of the third semiconductor chip 103. The other side surface SS4_1 of the third die attach pattern 213_1 may be disposed inwards of the other side surface SS5_1 of the third semiconductor chip 103 and, as such, the third die attach pattern 213_1 may expose a portion of a back surface FBb of the third semiconductor chip 103 without covering the portion of the back surface FBb. For example, a width Wp of the exposed portion of the back surface FBb of the third semiconductor chip 103 may be about 25 μm or less. In an embodiment, the width Wp of the exposed portion of the back surface FBb of the third semiconductor chip 103 may be substantially equal to the width Wo of the exposed portion of the back surface FBa of the second semiconductor chip 102. In an embodiment, the width Wp of the exposed portion of the back surface FBb of the third semiconductor chip 103 may differ from the width Wo of the exposed portion of the back surface FBa of the second semiconductor chip 102. In an embodiment, a fifth recess R5 may be defined by the front surface FSa of the second semiconductor chip 102, the other side surface SS4_1 of the third die attach pattern 213_1 and the exposed portion of the back surface FBb of the third semiconductor chip 103. The fifth recess R5 may be formed to be concave or recessed inwards of the third die attach pattern 213_1 between the second semiconductor chip 102 and the third semiconductor chip 103. The fifth recess R5 may be disposed at an opposite side of the third die attach pattern 213_1 as the second recess R2.

Although not shown in FIG. 4, referring to FIG. 3, the semiconductor package 2 may further include a sixth recess R6 defined by the third semiconductor chip 103, the fourth die attach pattern 214_1 and the fourth semiconductor chip 104. The sixth recess R6 may be disposed at an opposite side of the fourth die attach pattern 214_1 as the third recess R3.

Figure 5:
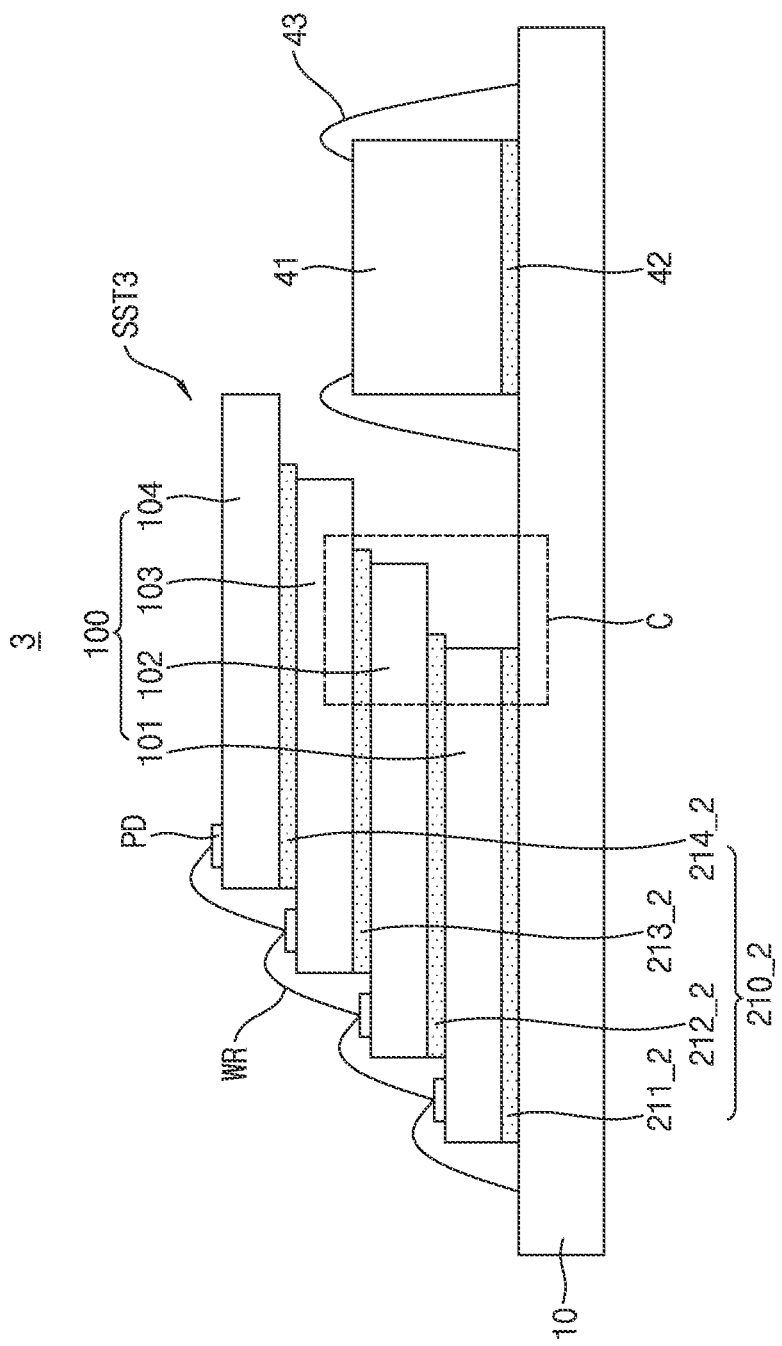
FIG. 5 is a sectional view of a semiconductor package according to an example embodiment of the disclosure.
Figure 6:
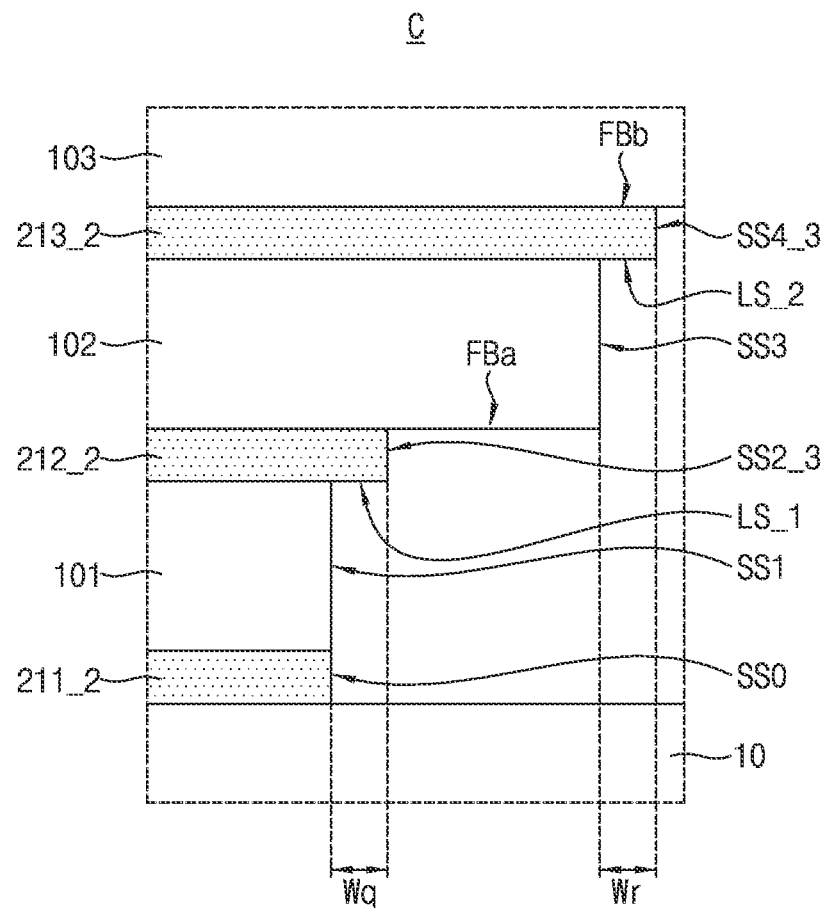
FIG. 6 is an enlarged view of a portion C of FIG. 5.

FIG. 5 is a sectional view of a semiconductor package according to an example embodiment of the disclosure. FIG. 6 is an enlarged view of a portion C of FIG. 5.

Referring to FIG. 5, a semiconductor package 3 may include a substrate 10, a semiconductor stack SST3 disposed on the substrate 10, and a semiconductor chip 41 disposed on the substrate 10 while being spaced apart from the semiconductor stack SST3. The semiconductor stack SST3 may include a plurality of semiconductor chips 100 and a plurality of die attach patterns 210_2.

The semiconductor stack SST3 may include first to fourth semiconductor chips 101, 102, 103 and 104, and first to fourth die attach patterns 211_2, 212_2, 213_2 and 214_2. In an embodiment, one side surface (e.g., a first side surface) of at least one of the second to fourth die attach patterns 212_2, 213_2 and 214_2 may be vertically misaligned from or horizontally offset from one side surface (e.g., a first side surface) of at least one of the semiconductor chips 101, 102 and 103 disposed just under the at least one of the second to fourth die attach patterns 212_2, 213_2 and 214_2. For example, one side surface of each of the second to fourth die attach patterns 212_2, 213_2 and 214_2 may be vertically misaligned from one side surface of a corresponding one of the second to fourth semiconductor chips 102, 103 and 104. Here, when viewed in a cross-sectional view, one side surface of each of the second to fourth die attach patterns 212_2, 213_2 and 214_2 may be a side surface disposed farthest from the pads PD of the semiconductor chips 100 from among side surfaces of each of the second to fourth die attach patterns 212_2, 213_2 and 214_2.

One side surface of each of the second to fourth die attach patterns 212_2, 213_2 and 214_2 may be disposed between one side surface of a corresponding one of the semiconductor chips 101, 102 and 103 disposed just under the second, third or fourth die attach pattern 212_2, 213_2 or 214_2 and one side surface of a corresponding one of the semiconductor chips 101, 102 and 103 disposed just above or over the second, third or fourth die attach patterns 212_2, 213_2 or 214_2. Each of the second to fourth die attach patterns 212_2, 212_3 and 212_4 may expose a portion of a back surface of a corresponding one of the semiconductor chips 102, 103 and 104 disposed just above or over the second, third or fourth die attach pattern 212_2, 212_3 or 212_4. A portion of a lower surface of each of the second to fourth die attach patterns 212_2, 212_3 and 212_4 may be exposed without vertically overlapping with a corresponding one of the first to third semiconductor chips 101, 102 and 103.

Referring to FIGS. 5 and 6, one side surface (e.g., a first side surface) SS2_3 of the second die attach pattern 212_2 may be offset (e.g., horizontally offset) from one side surface (e.g., a first side surface) SS1 of the first semiconductor chip 101. One side surface SS2_3 of the second die attach pattern 212_2 may be disposed inwards of one side surface SS3 of the second semiconductor chip 102 and, as such, may expose a portion of a back surface FBa of the second semiconductor chip 102. One side surface SS2_3 of the second die attach pattern 212_2 may be disposed outwards of one side surface SS1 of the first semiconductor chip 101 and, as such, a portion of a lower surface LS_1 of the second die attach pattern 212_2 may be exposed without contacting the first semiconductor chip 101. The second die attach pattern 212_2 may overhang the one side surface SS1 of the first semiconductor chip 101. For example, a width Wq of the exposed portion of the lower surface LS_1 of the second die attach pattern 212_2 may be about 25 μm or less. The width Wq of the exposed portion of the lower surface LS_1 of the second die attach pattern 212_2 may be smaller than the width of the exposed portion of the back surface FBa of the second semiconductor chip 102.

One side surface (e.g., a first side surface) SS4_3 of the third die attach pattern 213_2 may be offset (e.g., horizontally offset) from one side surface (e.g., a first side surface) SS3 of the second semiconductor chip 102. One side surface SS4_3 of the third die attach pattern 213_2 may be disposed inwards of one side surface (e.g., a first side surface) of the third semiconductor chip 103 and, as such, may expose a portion of a back surface FBb of the third semiconductor chip 103. One side surface SS4_3 of the third die attach pattern 213_2 may be disposed outwards of one side surface SS3 of the second semiconductor chip 102 and, as such, a portion of a lower surface LS_2 of the third die attach pattern 213_2 may be exposed without contacting the second semiconductor chip 102. The third die attach pattern 213_2 may overhang the one side surface SS3 of the second semiconductor chip 102. For example, a width Wr of the exposed portion of the lower surface LS_2 of the third die attach pattern 213_2 may be about 25 μm or less.

FIGS. 7 to 24 are views explaining a method for forming a semiconductor package.

Figure 7:
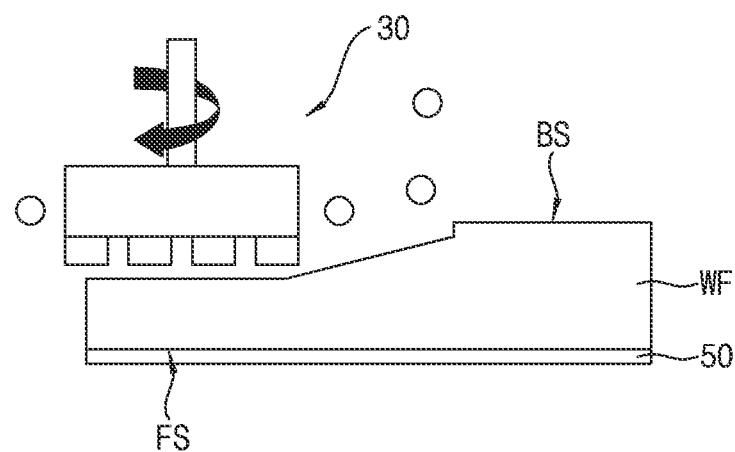
FIGS. 7 to 24 are views explaining a method for forming a semiconductor package.

Referring to FIG. 7, the method may include forming a protective film 50 at a front side or surface FS of a wafer WF. The protective film 50 may be mounted on the wafer WF in accordance with a lamination method. The protective film 50 may completely cover the front surface FS of the wafer WF. A circuit layer may be formed at the front surface FS of the wafer WF. For example, a gate electrode, a bit line, a capacitor, a wiring, etc. may be formed at the circuit layer, and various elements may be formed at the circuit layer in accordance with the kind of an associated semiconductor device. In addition, a redistribution layer, a metal layer and a connecting terminal for connection to an external circuit, and various elements for protection of a package or a semiconductor device such as a passivation layer, etc. may be formed at the circuit layer.

In an embodiment, the protective film 50 may be a transparent tape having transparency allowing a circuit pattern of the wafer WF or a surface shape of the front surface FS of the wafer WF to be viewed. In an embodiment, the protective film 50 may include a nonconductive film (NCF). For example, the protective film 50 may include an epoxy-based material or a silicon-based material. The protective film 50 may include a curing agent of a phenol type, an acid anhydride type or an amine type. The protective film 50 may include a heat-sensitive material, a thermoplastic material or an ultraviolet (UV) curable material which includes an acryl polymer.

The method may include back-grinding a back side or surface BS of the wafer WF. The back-grinding process may include grinding the back side BS of the wafer WF, and polishing the ground back side BS. The protective film 50 may protect the front surface FS of the wafer WF formed with a semiconductor device during back-grinding. For the back-grinding, at least one process of laser grinding, etching grinding or mechanical grinding may be used. For example, in the mechanical grinding process, the back side BS of the wafer WF may be ground using a grinding tool 30. The wafer WF back-ground at the back side BS thereof may be a thin wafer having a smaller thickness than the wafer before being subjected to back-grinding.

Figure 8:
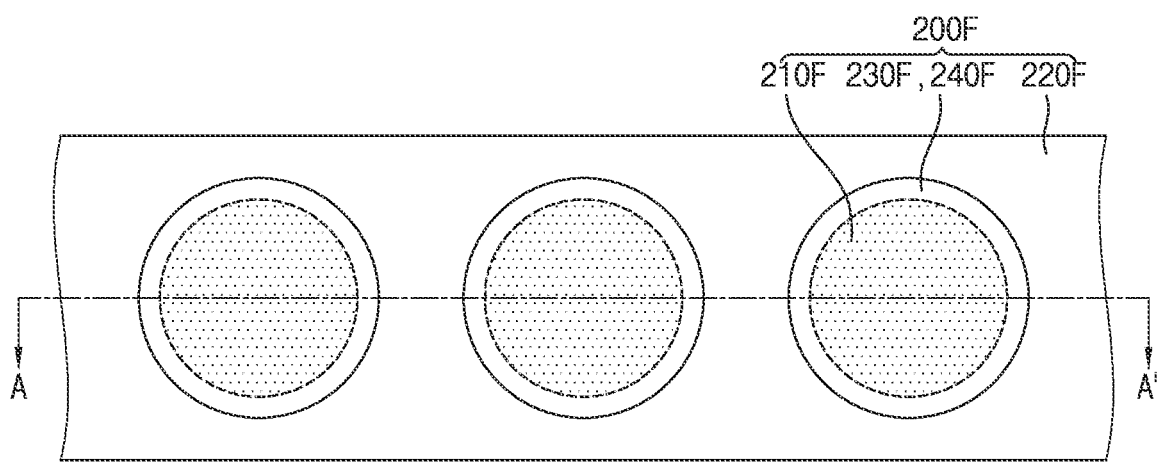
Figure 9:
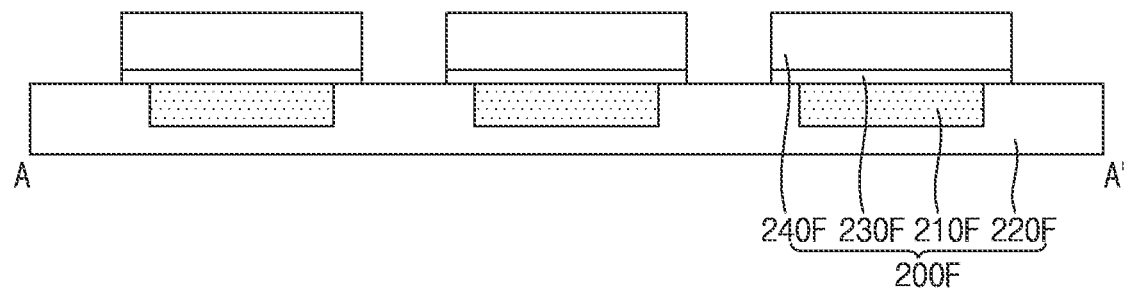

Referring to FIGS. 8 and 9, the method may include providing a multilayer adhesive film 200F. FIG. 8 is a plan view of the multilayer adhesive film 200F. FIG. 9 is a cross-sectional view taken along line A-A' in FIG. 8. The multilayer adhesive film 200F may include a die attach film 210F, a cover layer 220F, a photosensitive adhesive (PSA) layer 230F, and a base layer 240F.

In an embodiment, when viewed in a plan view, the shape and size of the die attach film 210F may be identical to the shape and size of a wafer (for example, "WF" in FIG. 7) to which the die attach film 210F will be attached. That is, when viewed in a plan view, the die attach film 210F may have a circular shape. The multilayer adhesive film 200F may include a plurality of die attach films 210F disposed to be spaced apart from one another. The plurality of die attach films 210F in the multilayer adhesive film 200F may be aligned in one direction. The die attach film 210F may be an adhesive film such as a direct adhesive film (DAF). For example, the die attach film 210F may include a resin having adhesion.

The cover layer 220F may be an elongated strap. The cover layer 220F may partially cover a surface of the die attach film 210F. The cover layer 220F may cover a lower surface and a side surface of the die attach film 210F. A plurality of die attach films 210F may be disposed in the cover layer 220F in a longitudinal direction of the cover layer 220F. In an embodiment, the cover layer 220F may cover the lower surface of the die attach film 210F while exposing the side surface of the die attach film 210F. The cover layer 220F may function to wind the multilayer adhesive film 200F around a roll while protecting the die attach film 210F. For example, the cover layer 220F may include polyethylene terephthalate (PET).

The PSA layer 230F and the base layer 240F may be disposed on the die attach film 210F and the cover layer 220F. The multilayer adhesive film 200F may include a plurality of PSA layers 230F respectively corresponding to a plurality of die attach films 210F. Although not shown in the drawings, in an embodiment, the plurality of PSA layers 230F may be connected to one another at edges thereof. The PSA layer 230F may directly completely cover an upper surface of the die attach film 210F. The PSA layer 230F may directly cover at least a portion of an upper surface of the cover layer 220F. In an embodiment, when viewed in a plan view, the PSA layer 230F may have a shape corresponding to a shape of the die attach film 210F. For example, when viewed in a plan view, the PSA layer 230F may have a circular shape. The area of the PSA layer 230F may be greater than the area of the die attach film 210F. In an embodiment, the PSA layer 230F may have a strap shape corresponding to the shape of the cover layer 220F. As such, one PSA layer 230F, which is formed to have a single body, may cover a plurality of die attach films 210F. In this case, the PSA layer 230F may completely cover the upper surface of the cover layer 220F. For example, the PSA layer 230F may be a UV curable film. The PSA layer 230F may maintain high adhesion to the die attach film 210F before UV curing thereof, but may exhibit a great reduction in adhesion after UV curing thereof and, as such, may be easily peeled off of the die attach film 210F.

The base layer 240F may be disposed on the PSA layer 230F. The multilayer adhesive film 200F may include a plurality of base layers 240F respectively corresponding to a plurality of PSA layers 230F. In an embodiment, when the plurality of PSA layers 230F is connected to one another at edges thereof, the plurality of base layers 240F may also be connected to one another at edges thereof. The base layer 240F may be spaced apart from the die attach film 210F and the cover layer 220F. The base layer 240F may completely cover an upper surface of the PSA layer 230F. When viewed in a plan view, the base layer 240F may have a shape corresponding to the shape of the PSA layer 230F. For example, when viewed in a plan view, the base layer 240F may have a circular shape. In an embodiment, when the PSA layer 230F has a strap shape, the base layer 240F may also have a strap shape. For example, the base layer 240F may include polyolefin (PO) or polyvinylchloride (PVC).

Figure 10:
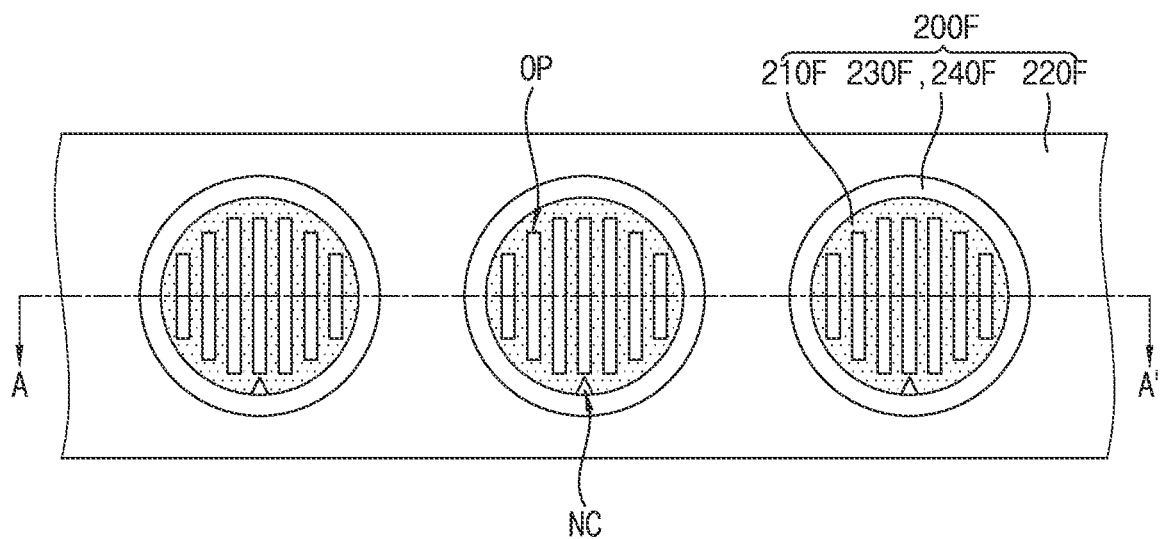
Figure 11:
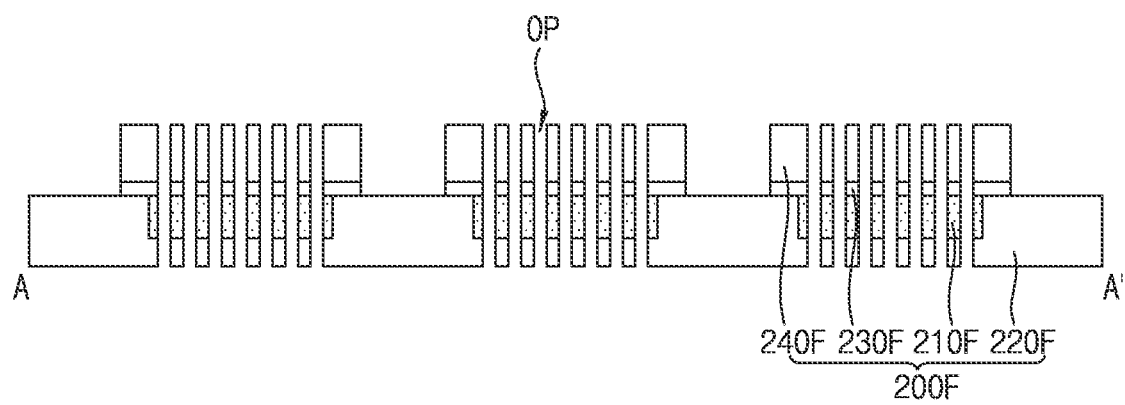

Referring to FIGS. 10 and 11, the method may include forming an opening OP at the multilayer adhesive film 200F. The opening OP may be formed in plural. The opening OP may extend vertically through the cover layer 220F, the die attach film 210F, the PSA layer 230F and the base layer 240F of the multilayer adhesive film 200F. The opening OP may be formed only in a region where all of the cover layer 220F, the die attach film 210F, the PSA layer 230F and the base layer 240F in the multilayer adhesive film 200F overlap vertically. The opening OP may not be formed in a region where any one of the cover layer 220F, the die attach film 210F, the PSA layer 230F and the base layer 240F does not overlap vertically with the remaining ones of the cover layer 220F, the die attach film 210F, the PSA layer 230F and the base layer 240F. For example, the opening OP may be formed through a laser cutting process.

The method may further include forming a notch NC at the multilayer adhesive film 200F. The notch NC may be formed at an edge of the die attach film 210F. The notch NC may be formed to extend vertically through the multilayer adhesive film 200F. The notch NC may extend vertically through each of the cover layer 220F, the die attach film 210F, the PSA layer 230F and the base layer 240F in the multilayer adhesive film 200F. The notch NC may be formed in a region where all of the cover layer 220F, the die attach film 210F, the PSA layer 230F and the base layer 240F overlap vertically. The notch NC may be used for alignment of the die attach film 210F with a wafer (for example, "WF" in FIG. 7) upon attaching the die attach film 210F to the wafer WF. For example, upon attaching the die attach film 210F to the wafer WF, the notch NC of the die attach film 210F may be vertically aligned with a notch of the wafer WF (cf. FIG. 14). The notch NC may include a V shape recessed to be concave or narrow toward a center of the multilayer adhesive film 200F. For example, when viewed in a plan view, the notch NC may have a triangular shape or a sector shape. The notch NC may be formed through a laser cutting process. In an embodiment, a flat zone may be formed at the multilayer adhesive film 200F, in place of the notch NC. The flat zone may be formed by cutting a portion of the multilayer adhesive film 200F to have a straight line shape.

Figure 12:
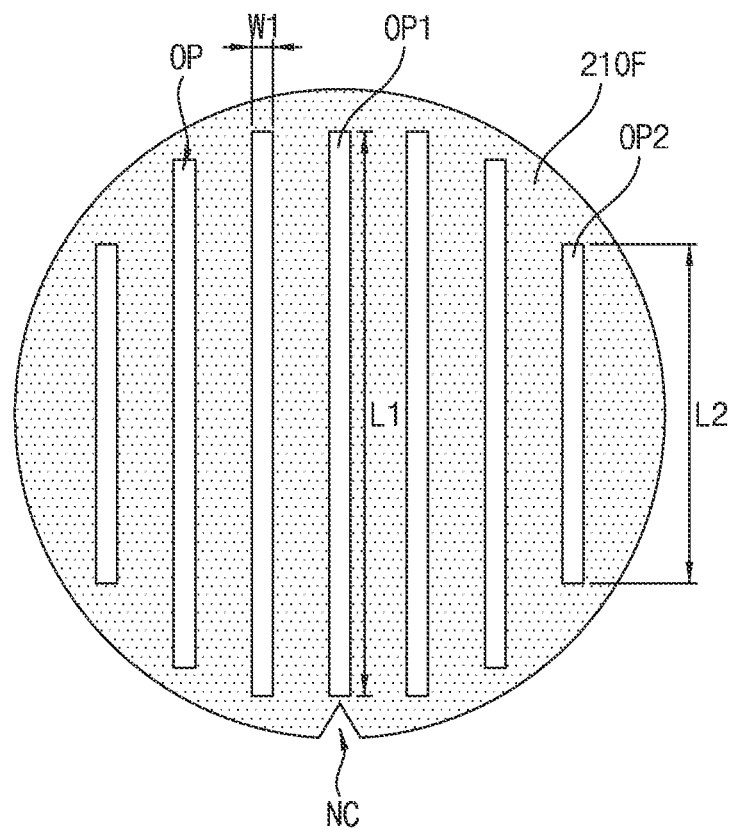

FIG. 12 is an enlarged plan view only showing one die attach film 210F in a state of being separated from the multilayer adhesive film 200F of FIG. 10.

Referring to FIG. 12, when viewed in a plan view, the opening OP may have a rectangular shape extending lengthwise in one direction. For example, when viewed in a plan view, the opening OP may be elongated and may have a bar or line shape. A plurality of openings OP may be disposed in parallel to one another. The plurality of openings OP may be spaced apart from one another by a uniform distance. In an embodiment, the plurality of openings OP may have the same width W1, but may have different lengths L1 and L2. Some of the plurality of openings OP may have the same length, and others of the plurality of openings OP may have different lengths. Those of the plurality of openings OP disposed gradually nearer to a center of the die attach film 210F may have gradually increased lengths, respectively, whereas those of the plurality of openings OP disposed gradually farther from the center of the die attach film 210F may have gradually decreased lengths, respectively. For example, a length L1 of a first opening OP1 disposed at or nearest to the center of the die attach film 210F from among the plurality of openings OP may have a maximum one of the lengths of the openings OP. A length L2 of a second opening OP2 disposed farthest from the center of the die attach film 210F from among the plurality of openings OP may have a minimum one of the lengths of the openings OP.

In an embodiment, the width W1 of the opening OP may be determined in accordance with a width (cf. "W2" in FIG. 16) of one chip ("CH" in FIG. 16) included in the wafer WF. Here, the width W2 of one chip CH may be a length of a side wall of the chip CH extending in the same direction as the width W1 of the opening OP. For example, the width W1 of the opening OP may be 1 to 10% of the width W2 (cf. FIG. 16) of one chip CH (FIG. 16) included in the wafer WF. For example, the width W1 of the opening OP may be about 200 to 800 μm. In an embodiment, the length of the opening OP may be varied in accordance with the size of a wafer, to which the die attach film 210F will be attached, that is, the size of the die attach film 210F. For example, the maximum length L1 of the opening OP may be 80 to 98% of the diameter of the die attach film 210F. The minimum length L2 of the opening OP may be 20 to 70% of the diameter of the die attach film 210F. Although only the die attach film 210F and the opening OP thereof are shown in FIG. 12, openings having the same configuration as that of the die attach film 210F may be formed at the cover layer 220F, the PSA layer 230F and the base layer 240F, respectively.

The position, at which the opening OP is formed in the die attach film 210F of the multilayer adhesive film 200F, may be determined in accordance with a scribe lane of the wafer WF to which the die attach film 210F will be attached. Associated contents will be described in detail with reference to FIGS. 15 and 16.

Figure 13:
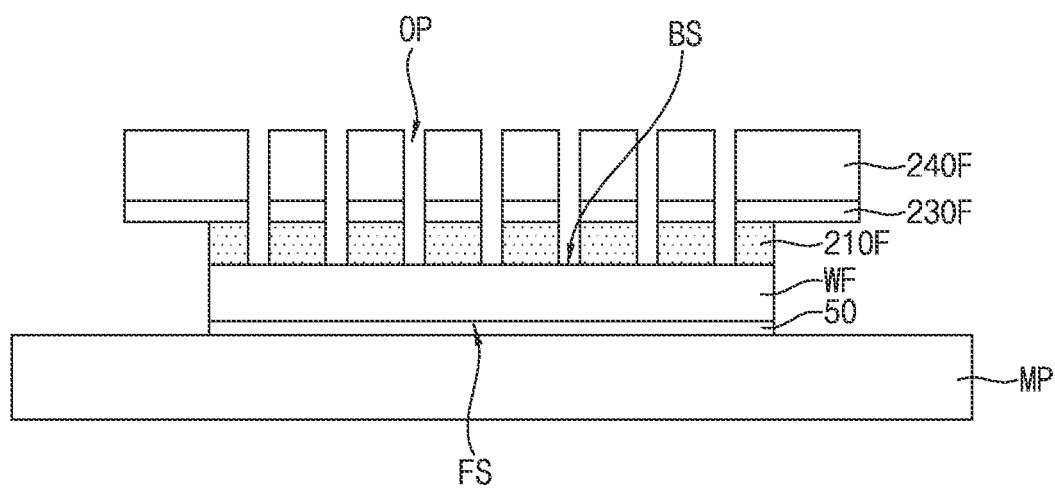

Referring to FIG. 13, the method may include removing the cover layer 220F from the multilayer adhesive film 200F formed with the opening OP, and attaching the die attach film 210F to the wafer WF. In accordance with removal of the cover layer 220F from the multilayer adhesive film 200F, the lower surface and the side surface of the die attach film 210F may be exposed. The cover layer 220F may be peeled off of the multilayer adhesive film 200F, thereby exposing the lower surface of the die attach film 210F and, as such, the die attach film 210F may be attached to the wafer WF. Before attachment of the die attach film 210F to the wafer WF, the wafer WF, to which the protective film 50 is attached, may be disposed on a support base MP. For example, the support base MP may be a ring-shaped frame to which a mounting tape is attached. In an embodiment, the wafer WF may be disposed on the support base MP after removal of the protective film 50 from the wafer WF. The die attach film 210F may be attached to the wafer WF after disposition of the wafer WF on the support base MP.

Figure 14:
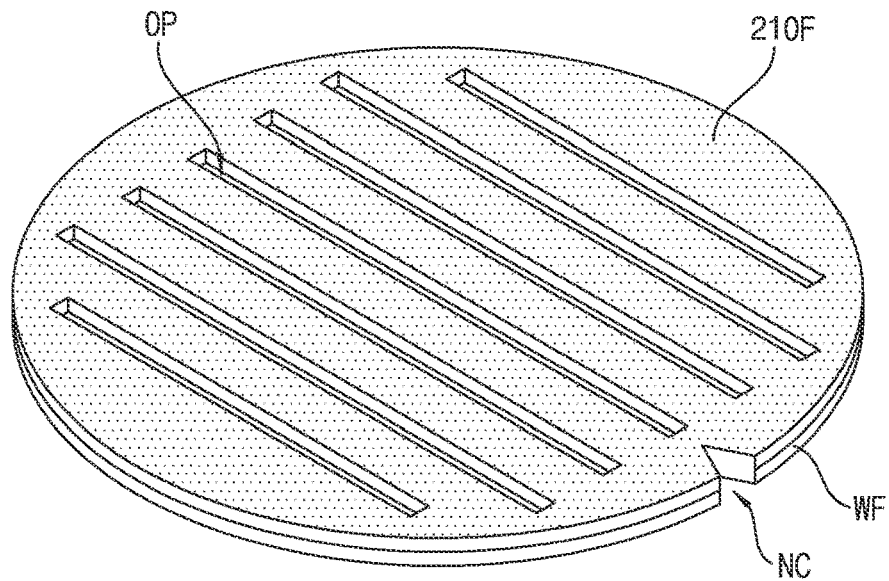

FIG. 14 is a perspective view showing an attachment state of the die attach film 210F and the wafer WF when the multilayer adhesive film 200F and the wafer WF are attached to each other, as shown in FIG. 13. In FIG. 14, illustration of the PSA layer 230F and the base layer 240F of the multilayer adhesive film 200F is omitted. Referring to FIG. 14, the die attach film 210F may be attached to the wafer WF such that the notch NC of the die attach film 210F is aligned with the notch of the wafer WF. Although not shown in the drawing, the notches respectively formed at the PSA layer 230F and the base layer 240F may be aligned with the notch of the wafer WF. Using the position of the notch NC, the position of the opening OP with respect to the wafer WF may be appropriately adjusted.

Figure 15:
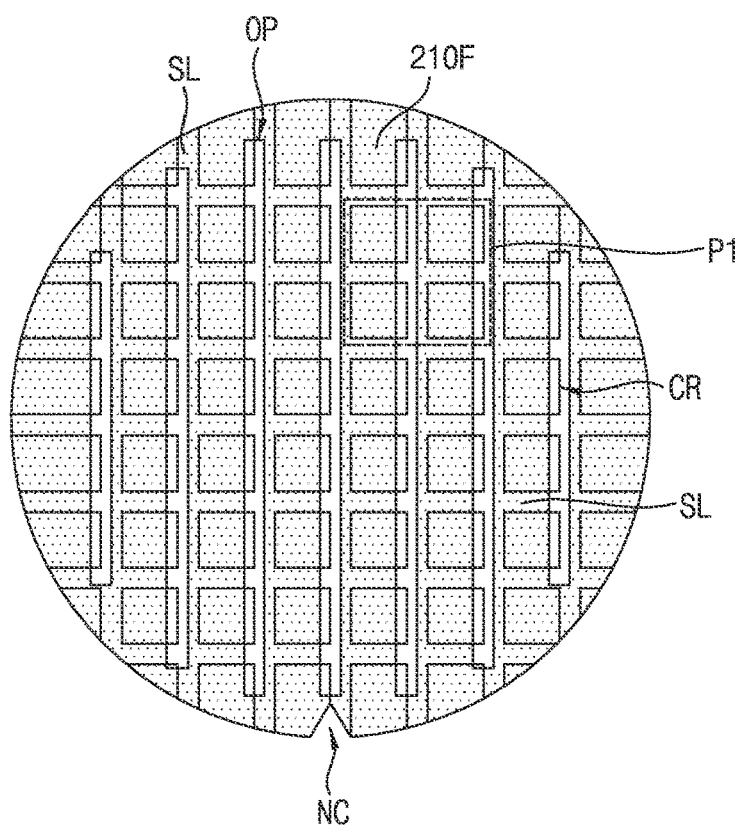
Figure 16:
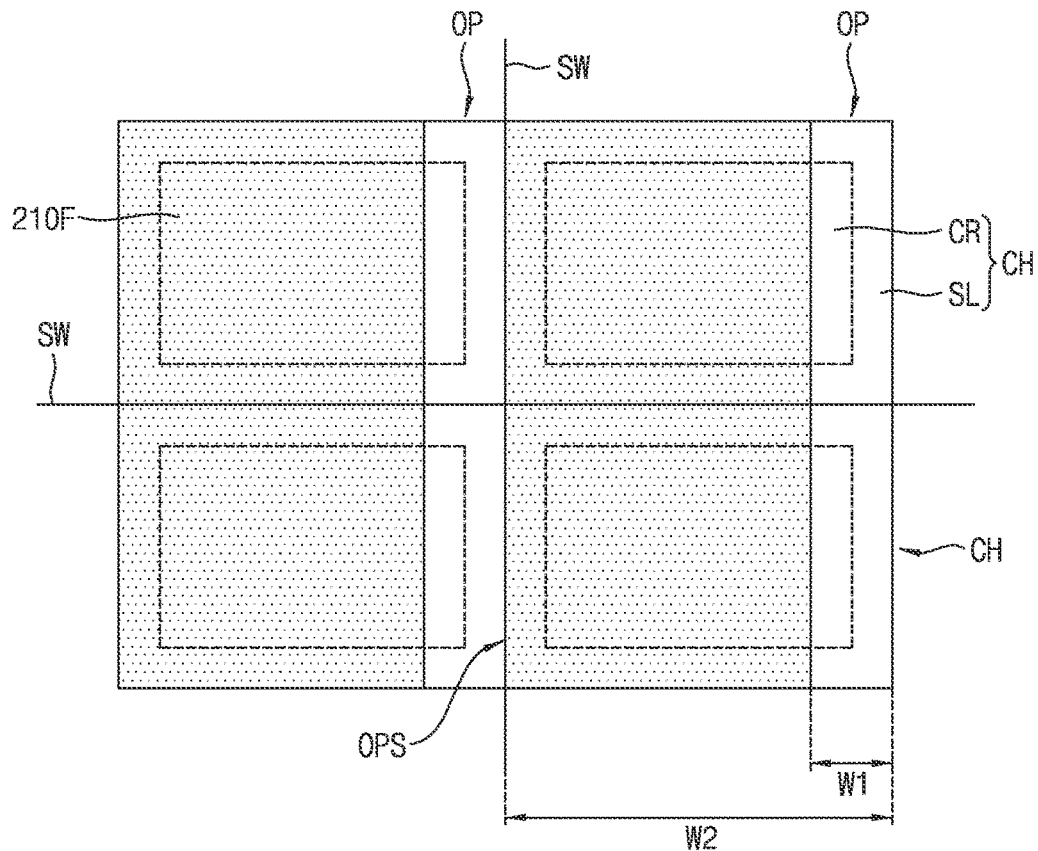

FIG. 15 is a plan view of the wafer WF to which the multilayer adhesive film 200F is attached, as shown in FIG. 14. FIG. 15 shows the opening OP of the die attach film 210F and a scribe lane formed at the front surface FS of the wafer WF when viewing a state, in which the die attach film 210F is attached to the wafer WF, from an upper side of the die attach film 210F. FIG. 16 is an enlarged view of a portion P1 of FIG. 15. The portion P1 may include four chips CH from among chips CH included in the wafer WF.

Referring to FIGS. 14 to 16, the wafer WF may include a scribe lane SL and a chip region CR. The chip region CR may be defined by the scribe lane SL. When viewed in a plan view, the chip region CR may have a quadrangular shape, and the scribe lane SL may surround the periphery of the chip region CR. The wafer WF may include a plurality of chips CH, and each chip CH may include a chip region CR and a portion of the scribe lane SL. The chips CH may extend in a longitudinal direction of the scribe lane SL, and may be divided from one another along a sawing line SW extending through a center line of the scribe lane SL. Subsequently, the wafer WF may be cut along the sawing line SW and, as such, may be separated into a plurality of chips CH. The sawing line SW may be a virtual line not indicated at the wafer WF.

The opening OP may be formed in a region of the multilayer adhesive film 200F corresponding to a region where it is unnecessary to maintain attachment of the die attach film 210F to chips CH in a state in which the wafer WF, to which the multilayer adhesive film 200F, that is, the die attach film 210F, is attached, is separated into the chips CH. In an embodiment, when viewed in a state in which the die attach film 210F and the front surface of the wafer WF are vertically overlapped with each other under the condition that the die attach film 210F adheres to the back side of the wafer WF, the opening OP may be formed to extend along the scribe lane SL extending in one direction. At least a portion of the opening OP formed at the multilayer adhesive film 200F or the die attach film 210F may vertically overlap with the scribe lane SL. In addition, the opening OP may vertically overlap with the chip region CR (or a portion of the chip region CR). In an embodiment, one side surface OPS of the opening OP of the multilayer adhesive film 200F may be formed to be aligned with the sawing line SW. In order to form the opening OP at the multilayer adhesive film 200F such that the opening OP is disposed at the above-described position and has the above-described configuration, the position and width of the scribe lane SL of the wafer WF, to which the multilayer adhesive film 200F will be attached, and the position of the sawing line SW according thereto may be taken into consideration upon forming the opening OP, as shown in FIGS. 10 and 11. In addition, as described above, the width W1 of the opening OP may be determined in accordance with the width W2 of one chip CH, and the length of the opening OP may be determined in accordance with the diameter of the wafer WF. For example, the width W1 of the opening OP may be about 1 to 10% of the width W2 of one chip CH.

Figure 17:
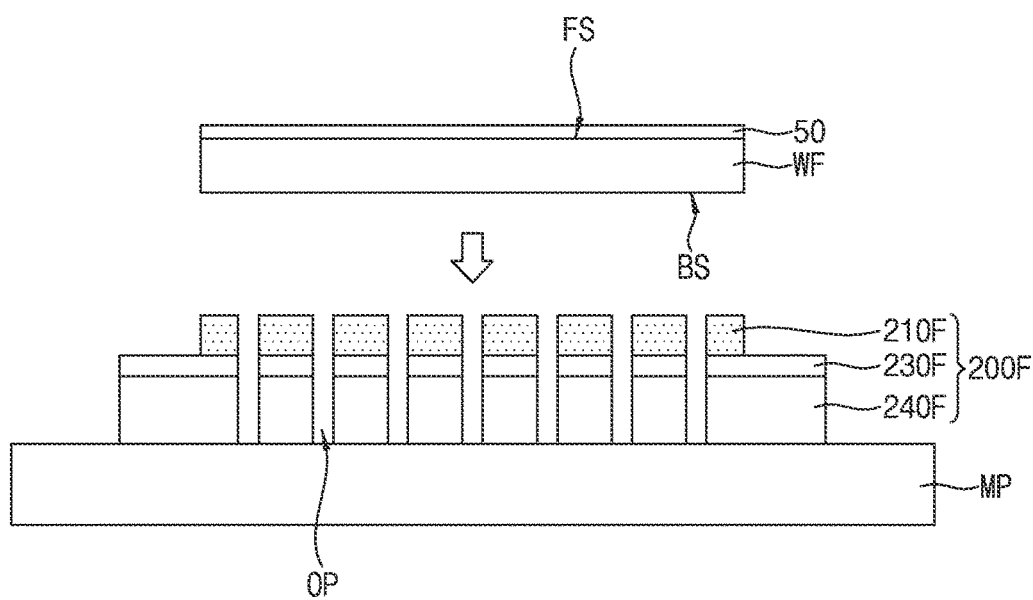

Referring to FIG. 17, in an embodiment, the multilayer adhesive film 200F may be disposed on the support base MP, and the wafer WF may be mounted on the multilayer adhesive film 200F disposed on the support base MP. The multilayer adhesive film 200F may be disposed on the support base MP such that the base layer 240F is directly laid on the support base MP, and the die attach film 210F is disposed at a side far from the support base MP. After disposition of the multilayer adhesive film 200F on the support base MP, the cover layer 220F may be removed and, as such, the lower surface and the side surface of the die attach film 210F may be exposed. A portion of the upper surface of the PSA layer 230F may also be exposed. Thereafter, the wafer WF may be attached to the die attach film 210F. The back side BS of the wafer WF may be directly attached to the lower surface of the die attach film 210F.

Figure 18:
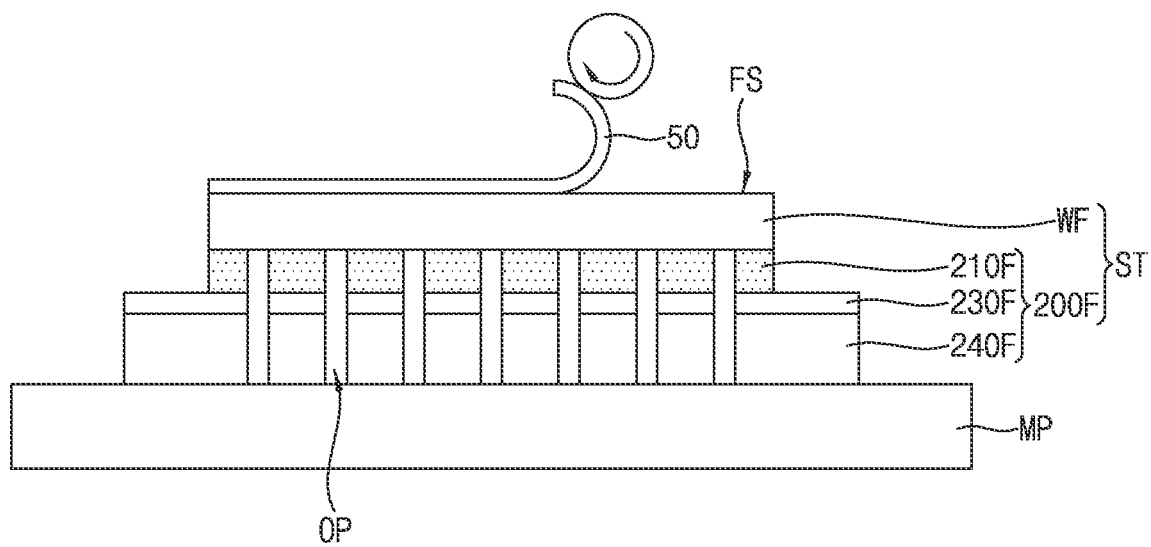

Referring to FIG. 18, the method may include removing the protective film 50 after execution of the process of FIG. 13 or FIG. 17. In the case in which the process of FIG. 13 has been executed, the wafer WF, to which the multilayer adhesive film 200F is attached, may be inverted such that the protective film 50 is upwardly exposed. Thereafter, the protective film 50 may be peeled off, thereby exposing the front surface FS of the wafer WF. The multilayer adhesive film 200F including the base layer 240F, the PSA layer 230F and the die attach film 210F may form one stack ST, together with the wafer WF.

Figure 19:
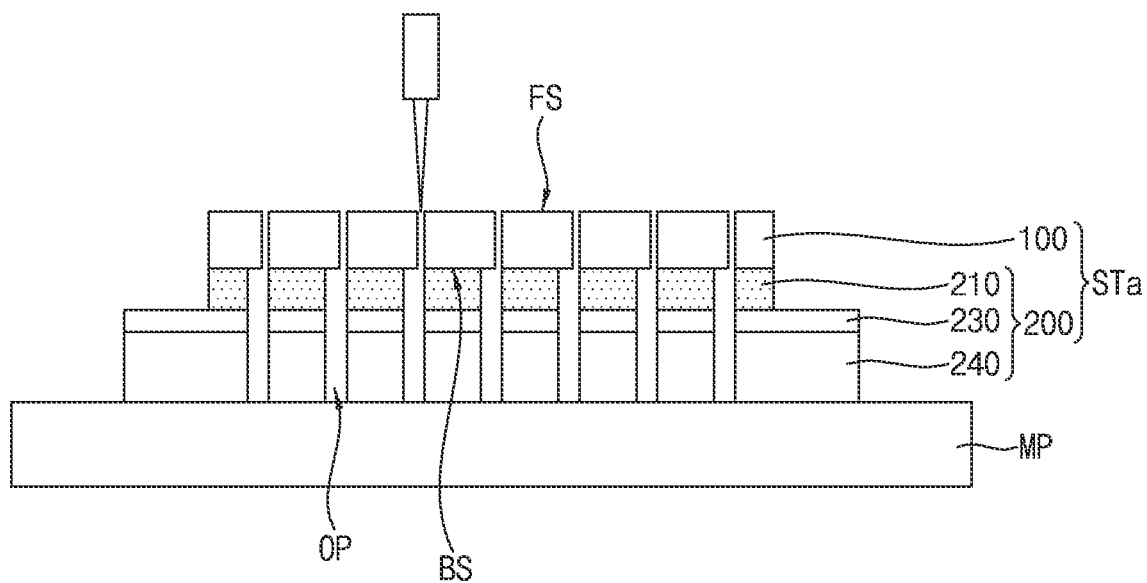

Referring to FIG. 19, the method may include separating the stack ST into individual stacks STa. Separation of the stack ST into a plurality of individual stacks STa may include separating the wafer WF into a plurality of semiconductor chips 100. In addition, separation of the stack ST into a plurality of individual stacks STa may include separating the multilayer adhesive film 200F into a plurality of individual films 200. One individual film 200 may include a base pattern 240, a PSA pattern 230, and a die attach pattern 210.

After the protective film 50 is removed, as shown in FIG. 18, the scribe lane (cf. "SL" in FIGS. 15 and 16) may be exposed at the front surface FS of the wafer WF. The wafer WF and the multilayer adhesive film 200F may be simultaneously cut along the sawing line ("SW" in FIG. 16), which is the center line of the scribe lane ("SL" in FIGS. 15 and 16). That is, the stack ST may be cut. Since the sawing line ("SW" in FIG. 16) is vertically aligned with one side surface of the opening OP, as described above, the stack ST may be cut along one side surface of the opening OP. As the stack ST is cut, the stack ST may be separated into individual stacks STa having a quadrangular shape when viewed in a plan view. For example, the stack ST may be separated into individual stacks STa through a laser sawing process. A portion of the back surface BS of the semiconductor chip 100 of each individual stack STa may contact the die attach pattern 210, and the other portion of the back surface BS may be exposed. One side surface of each individual film 200 may be aligned (e.g., vertically aligned) with one side surface (e.g., a first side surface) of the corresponding semiconductor chip 100. The other side surface of the individual film 200 may be misaligned from or unaligned with the other (e.g., second, opposite) side surface of the semiconductor chip 100. Accordingly, each individual stack STa may have an L-shaped cross-section.

Figure 20:
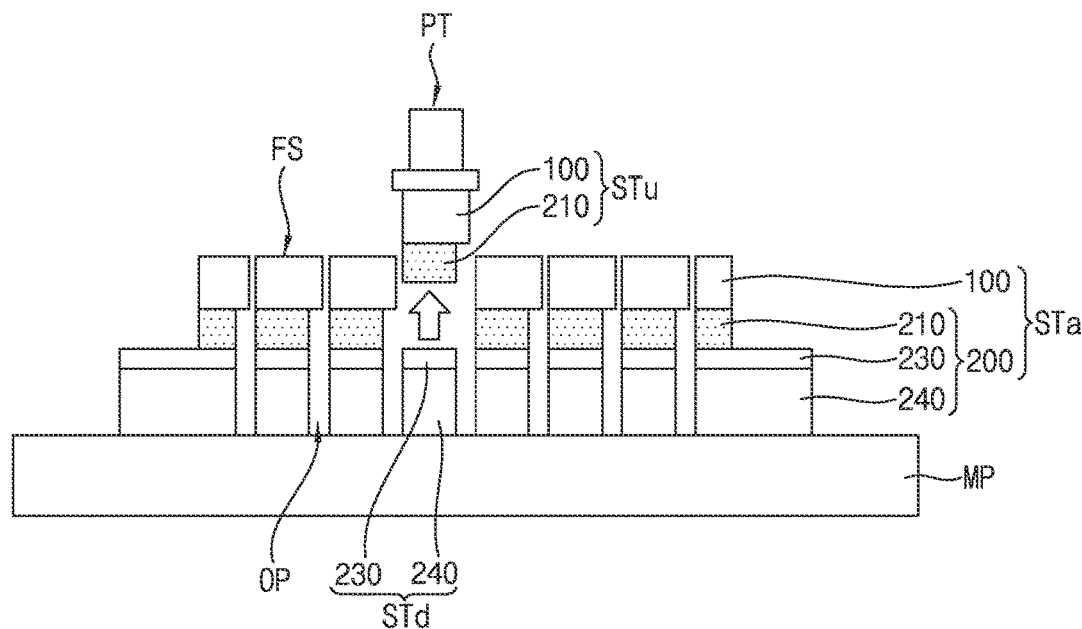

Referring to FIG. 20, the method may include separating each individual stack STa into a lower stack STd and an upper stack STu. Separation of the individual stack STa into the lower stack STd and the upper stack STu may include irradiating the individual stack STa, that is, the PSA pattern 230, with UV rays, thereby decreasing adhesion of the PSA pattern 230 to the die attach pattern 210, and then vacuum-attracting the front surface FS of the semiconductor chip 100 using a pick-up tool PT, thereby picking up the semiconductor chip 100. As the semiconductor chip 100 is picked up by the pick-up tool PT, the die attach pattern 210 and the PSA pattern 230 may be separated from each other. Accordingly, the individual stack STa may be separated into the lower stack STd, which includes the base pattern 240 and the PSA pattern 230, and the upper stack STu, which includes the die attach pattern 210 and the semiconductor chip 100. The lower stack STd may still be seated on the support base MP, and only the upper stack STu may be picked up by the pick-up tool PT.

Figure 21:
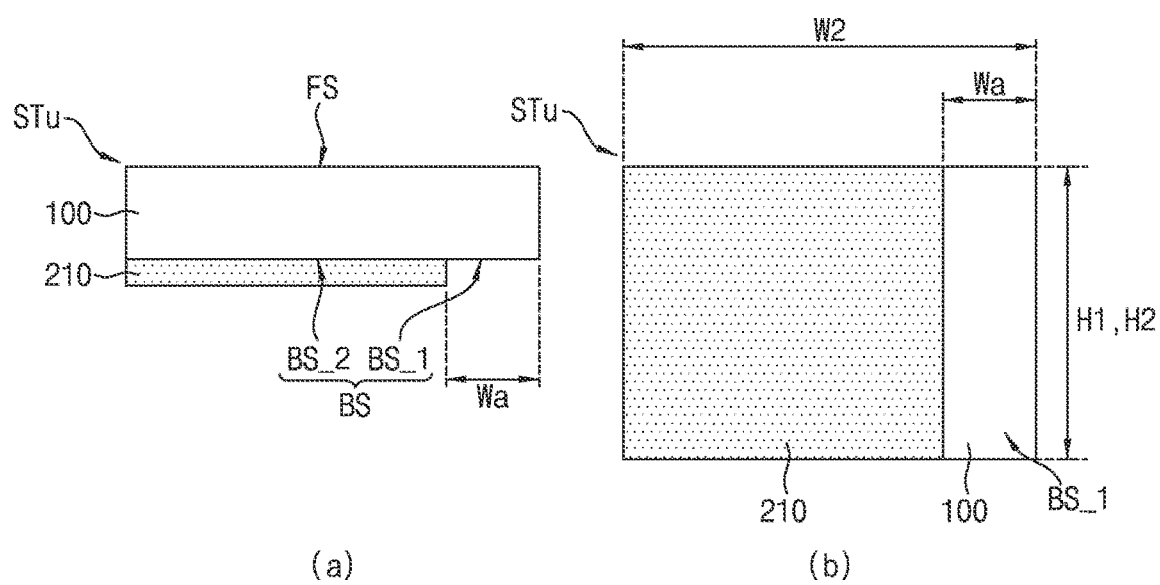

FIG. 21 shows a sectional view and a plan view showing an upper stack STu according to an example embodiment of the disclosure in an enlarged state. Although the thickness ratio between a die attach pattern 210 and a semiconductor chip 100 shown in FIG. 21 is shown as being different from those of other drawings, constituent elements designated by the same reference numerals in the drawings of the disclosure are the same. Sizes and thicknesses of constituent elements shown in the drawings of the disclosure are given merely for convenience of description, and may be shown in an exaggerated or scaled-down state.

Referring to FIG. 21, the upper stack STu may include a semiconductor chip 100, and a die attach pattern 210 attached to a back surface BS of the semiconductor chip 100. The area of the die attach pattern 210 may be smaller than the area of the semiconductor chip 100. The die attach pattern 210 may cover a portion of the back surface BS of the semiconductor chip 100 while exposing the other portion of the back surface BS. The area of a first portion BS_1 exposed from among portions of the back surface BS of the semiconductor chip 100 may be smaller than the area of a second portion BS_2 covered by the die attach pattern 210 from among the portions of the back surface BS of the semiconductor chip 100. A width Wa of the first portion BS_1 may be substantially equal to a width W1 of an opening (cf. "OP" in FIG. 12), which was formed at a die attach film (cf. "210" in FIG. 12). In an embodiment, the width Wa of the first portion BS_1 may be about 1 to 10% of a width W2 of the semiconductor chip 100. Here, the width Wa of the first portion BS1 may mean the length of a side surface having a relatively small length from among side surfaces of the semiconductor chip 100 defining the first portion BS1. The width W2 of the semiconductor chip 100 may mean the length of a side surface of the semiconductor chip extending in the same direction as the width Wa of the first portion BS1. A length H1 of the first portion BS_1 may be the length of a side surface having a relatively great length from among the side surfaces of the semiconductor chip 100 defining the first portion BS1. The length H1 of the first portion BS_1 may correspond to a length H2 of the die attach pattern 210.

Figure 22:
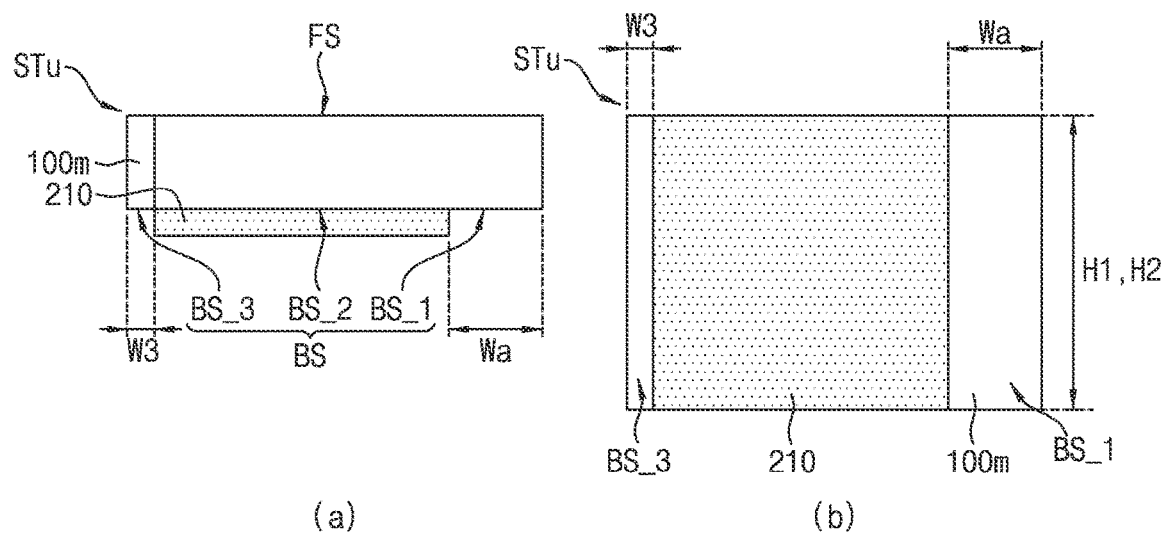

FIG. 22 shows a sectional view and a plan view showing an upper stack STu according to an example embodiment of the disclosure in an enlarged state.

Referring to FIG. 22, a die attach pattern 210 included in the upper stack STu may cover a portion of a back surface BS of a semiconductor chip 100m while exposing the other portion of the back surface BS. The back surface BS of the semiconductor chip 100m may include a first portion BS_1 exposed by a die attach pattern 210, a second portion BS_2 covered by the die attach pattern 210, and a third portion BS_3 different from the first portion BS_1 while being exposed by the die attach pattern 210. The second portion BS_2 may be disposed between the first portion BS_1 and the third portion BS_3. The first portion BS_1 may be adjacent to one-side edge of the semiconductor chip 100m, whereas the third portion BS_3 may be adjacent to the other-side edge opposite to the one-side edge. Although no pad is shown in FIG. 22, the first portion BS_1 is disposed at a position relatively far from a pad disposed at a front surface FS of the semiconductor chip 100m, whereas the third portion BS_3 may be disposed at a position adjacent or relatively near the pad. In an embodiment, a width Wa of the first portion BS1 may be greater than a width W3 of the third portion BS_3. For example, the width W3 of the third portion BS_3 may be about 25 μm or less. When a stack ST is separated into individual stacks STa, as shown in FIG. 19, a sawing line, along which the stack ST is cut, may be misaligned from or unaligned with or horizontally offset from one side surface of an opening OP. That is, the sawing line of the stack ST may be offset from one side surface of the opening OP by a predetermined distance. As such, one side surface of the semiconductor chip 100m and one side surface of the corresponding individual stack STa may be vertically misaligned from or unaligned with each other and, as such, the third portion BS_3 not covered by the die attach pattern 210 may be formed at the semiconductor chip 100m. The predetermined distance may correspond to the width W3 of the third portion BS_3. When the third portion BS_3 is formed at the semiconductor chip 100m, the width Wa of the first portion BS_1 may differ from the width (cf. "W1" in FIG. 16) of the opening OP.

Figure 23:
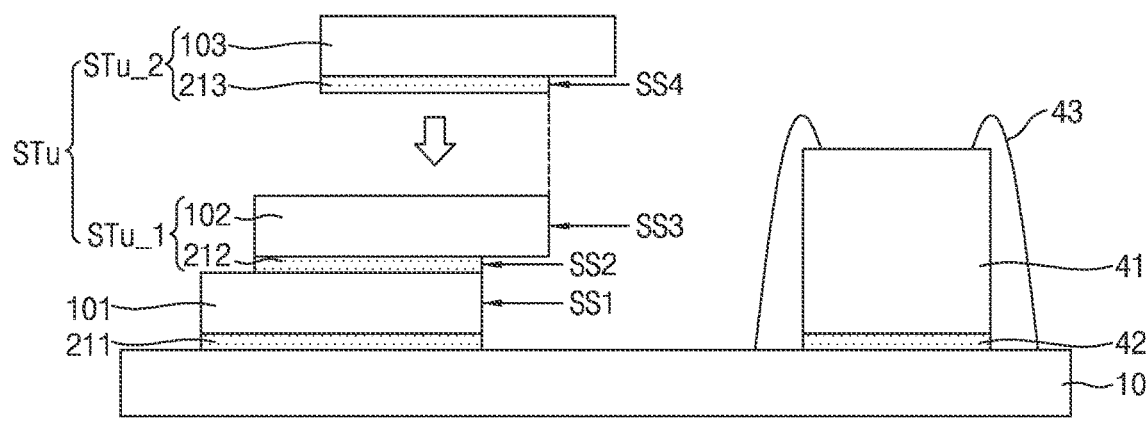

Referring to FIG. 23, the method may include forming a semiconductor stack by stacking an upper stack STu on a substrate 10. Stacking of the upper stack STu on the substrate 10 may include stacking an upper stack STu picked up by a pick-up tool (cf. "PT" in FIG. 20) on the substrate 10. The method may include providing a substrate 10, on which a semiconductor chip 101 is mounted, before stacking of the upper stack STu. That is, the method may include mounting the semiconductor chip 101 on the substrate 10. The semiconductor chip 101 may be attached to the substrate 10 by a die attach pattern 211. The die attach pattern 211 may differ from die attach patterns 212 and 213 of semiconductor chips 102 and 103 in the upper stack STu in that the die attach pattern 211 completely covers one surface (that is, a back surface) of the semiconductor chip 101.

A semiconductor stack may be formed through repetition of mounting a first upper stack STu_1 on the semiconductor chip 101, and stacking another upper stack, that is, a second upper stack STu_2, on the first upper stack STu_1 mounted on the semiconductor chip 101. The first and second upper stacks STu_1 and STu_2 may be stacked such that the semiconductor stack has a cascade structure. In an embodiment, one side surface (e.g., a first side surface) SS2 of the die attach pattern 212 of the first upper stack STu_1 may be aligned with or coplanar with one side surface (e.g., a first side surface) SS1 of the semiconductor chip 101. One side surface (e.g., a first side surface) SS4 of the die attach pattern 213 of the second upper stack STu_2 may be aligned with or coplanar with one side surface (e.g., a first side surface) SS3 of the semiconductor chip 102 of the first upper stack STu_1. A lower surface of the die attach pattern 212 of the first upper stack STu_1 may be completely bonded to the semiconductor chip 101. A lower surface of the die attach pattern 213 of the second upper stack STu_2 may be completely bonded to the semiconductor chip 102. Portions of back surfaces of the semiconductor chips 102 and 103 exposed without being covered by the die attach patterns 212 and 213, respectively, may not be vertically overlapped or vertically aligned with the semiconductor chip 101 and/or the semiconductor chip 102 disposed thereunder. The semiconductor chip 102 may overhang the one side surface SS2 of the die attach pattern 212 and the semiconductor chip 103 may overhang the one side surface SS4 of the die attach pattern 213.

The method may include mounting a semiconductor chip 41 on the substrate 10. The semiconductor chip 41 may be mounted on the substrate 10 after formation of the semiconductor stack. Alternatively, the semiconductor stack may be formed after mounting of the semiconductor chip 41 on the substrate 10. Mounting of the semiconductor chip 41 may include attaching the semiconductor chip 41 to the substrate 10 by an adhesive member 42, and then interconnecting the semiconductor chip 41 and the substrate 10 through wire bonding.

Although a procedure of stacking the upper stack STu described with reference to FIG. 21 is shown in FIG. 23, the upper stack STu described with reference to FIG. 22 may be stacked in accordance with the method.

Figure 24:
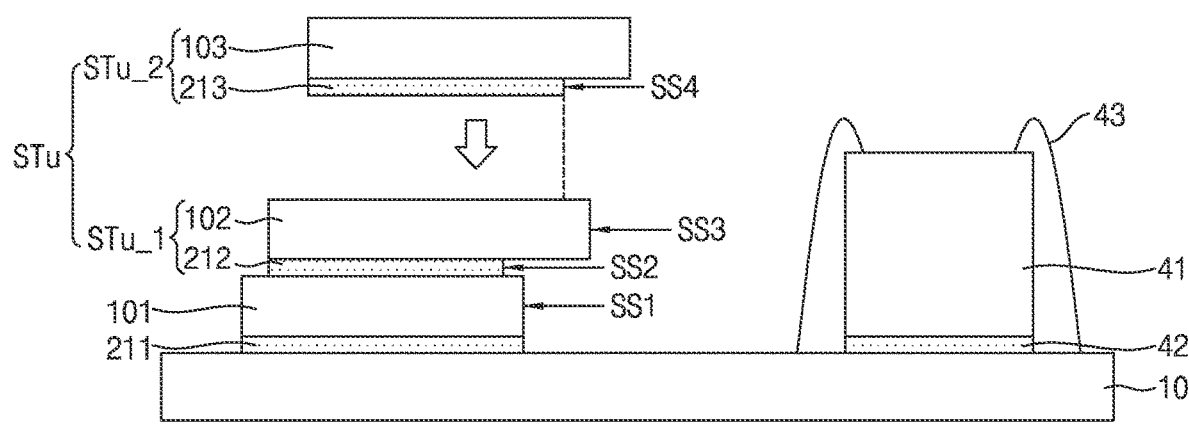

FIG. 24 shows a method for forming a semiconductor stack in accordance with an example embodiment of the disclosure.

The method of FIG. 24 differs from the method described with reference to FIG. 23 in that, although an upper stack STu is stacked on a substrate 10, thereby forming a semiconductor stack, as shown in FIG. 23, one-side surfaces SS2 and SS4 of die attach patterns 212 and 213 included in the upper stack STu are vertically misaligned from or horizontally offset from one-side surfaces SS1 and SS3 of semiconductor chips 101 and 102 just under the die attach patterns 212 and 213, respectively. As such, recesses may be formed at the semiconductor stack, as described with reference to FIGS. 1 and 3. Otherwise, lower surfaces of the die attach patterns 212 and 213 may be exposed, as shown in FIG. 5.

Figure 25:
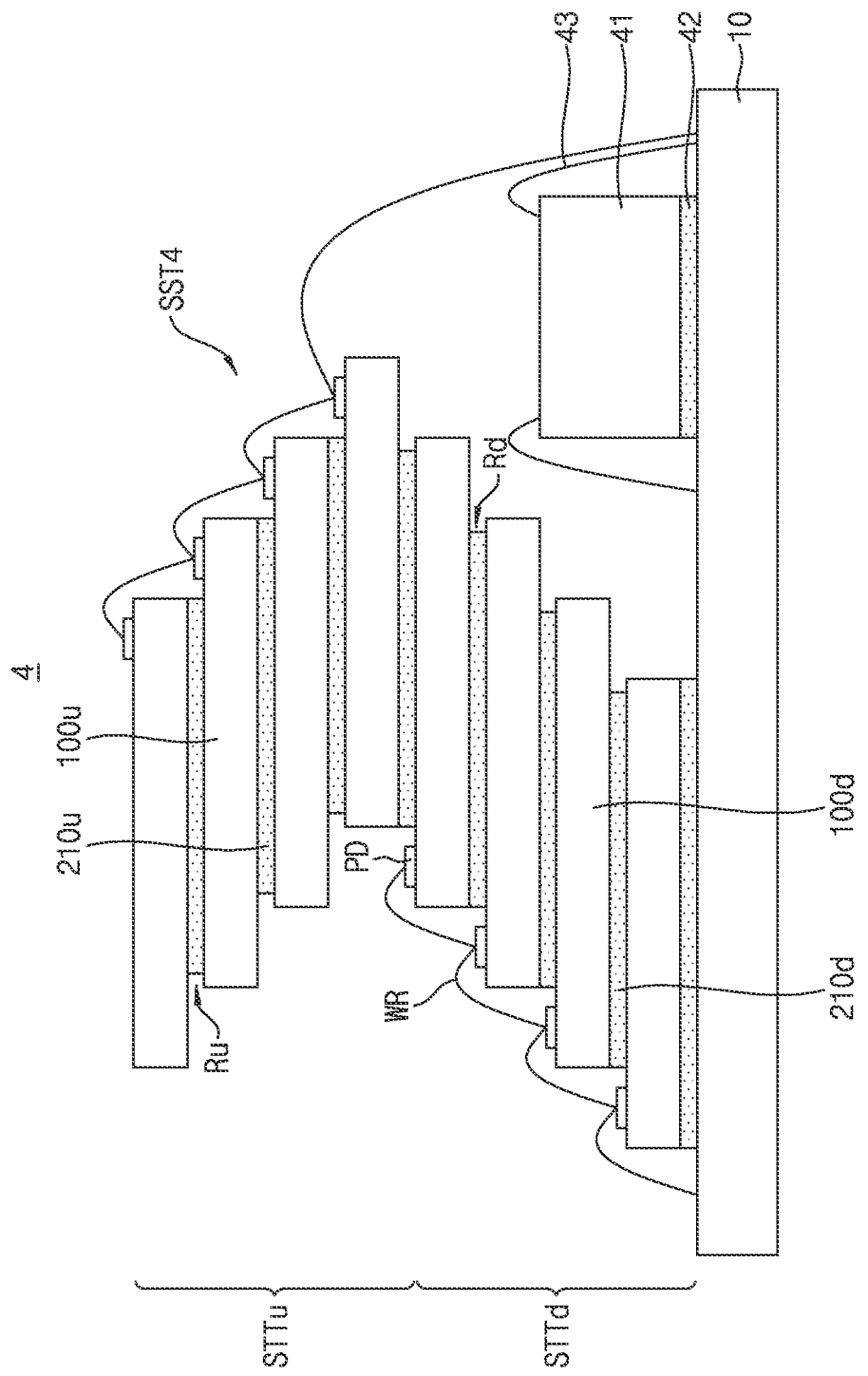
FIG. 25 is a sectional view of a semiconductor package according to an example embodiment of the disclosure.

FIG. 25 is a sectional view of a semiconductor package according to an example embodiment of the disclosure.

Referring to FIG. 25, a semiconductor package 4 may include a substrate 10, a semiconductor stack SST4 disposed on the substrate 10, and a semiconductor chip 41 disposed on the substrate 10 while being spaced apart from the semiconductor stack SST4.

The semiconductor stack SST4 may include a lower stack STTd and an upper stack STTu. In an embodiment, the lower stack STTd may be identical to any one of the semiconductor stacks SST1, SST2 and SST3 of FIGS. 1, 3 and 5. The semiconductor stack SST4 may further include the upper stack STTu which is disposed on the semiconductor stack SST1, SST2 or SST3 described with reference to FIG. 1, 3 or 5.

The lower stack STTd may include a plurality of lower semiconductor chips 100d and a plurality of lower die attach patterns 210d. The upper stack STTu may include a plurality of upper semiconductor chips 100u and a plurality of upper die attach patterns 210u. Although four lower semiconductor chips 100d and four upper semiconductor chips 100u are shown in FIG. 4, example embodiments of the disclosure are not limited thereto. Numbers of the lower semiconductor chips 100d and the upper semiconductor chips 100u may be more or less than four. The lower semiconductor chips 100d and the upper semiconductor chips 100u may be stacked in a stepped manner, and may be stacked while changing a stepping direction thereof. For example, the lower semiconductor chips 100d may be stacked in the form of a cascade ascending in a right direction (or descending in a left direction) such that a pad PD of each lower semiconductor chip 100d is exposed without being covered by the lower semiconductor chip 100d disposed just above the former lower semiconductor chip 100d, whereas the upper semiconductor chips 100u may be stacked in the form of a cascade ascending in a left direction (or descending in a right direction) such that a pad PD of each upper semiconductor chip 100u is exposed without being covered by the upper semiconductor chip 100u disposed just above the former upper semiconductor chip 100u. The pads PD may be disposed on a first edge or side (e.g., left edge or side) of the lower semiconductor chips 100d and the pads PD may be disposed on a second, opposite edge or side (e.g., right edge or side) of the upper semiconductor chips 100u.

Lower die attach patterns 210d may each be interposed between vertically adjacent ones of the lower semiconductor chips 100d. The lower semiconductor chips 100d may be stacked on the substrate 10 through the lower die attach patterns 210d. Upper die attach patterns 210u may each be interposed between vertically adjacent ones of the upper semiconductor chips 100u. The upper semiconductor chips 100u may be stacked on the substrate 10 through the upper die attach patterns 210u.

In an embodiment, the lower stack STTd and the upper stack STTu may include recesses Rd and Ru, respectively. Each lower recess Rd may be defined by vertically adjacent ones of the lower semiconductor chips 100d and the lower die attach pattern 210d disposed therebetween. Each upper recess Ru may be defined by vertically adjacent ones of the upper semiconductor chips 100u and the upper die attach pattern 210u disposed therebetween.

Figure 26:
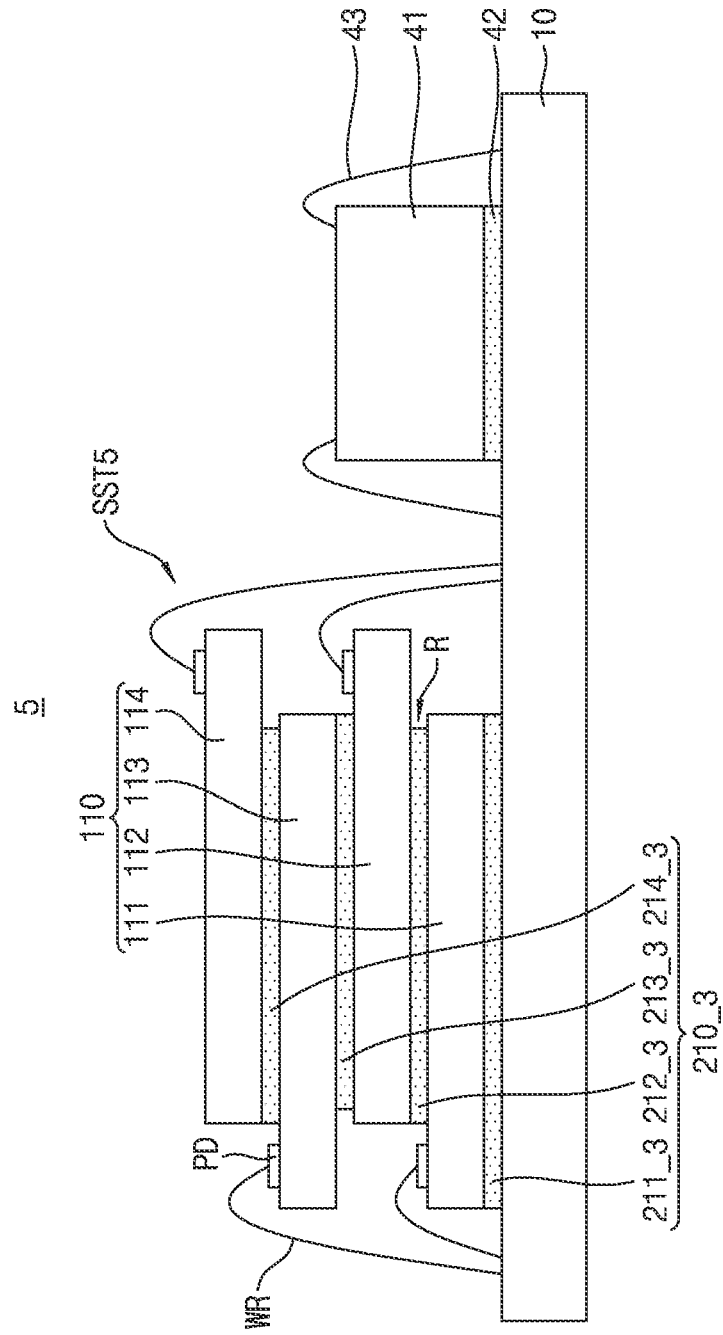
FIG. 26 is a sectional view of a semiconductor package according to an example embodiment of the disclosure.

FIG. 26 is a sectional view of a semiconductor package according to an example embodiment of the disclosure.

Referring to FIG. 26, a semiconductor package 5 may include a substrate 10, a semiconductor stack SST5 disposed on the substrate 10, and a semiconductor chip 41 disposed on the substrate 10 while being spaced apart from the semiconductor stack SST5. The semiconductor stack SST5 may include a plurality of semiconductor chips 110 and a plurality of die attach patterns 210_3. For example, the semiconductor stack SST5 may include first to fourth semiconductor chips 111, 112, 113 and 114, and first to fourth die attach patterns 211_3, 212_3, 213_3 and 214_4. Of course, example embodiments of the disclosure are not limited to the above-described conditions, and the number of the semiconductor chips 110 and the number of the die attach patterns 210_3 may be increased or decreased.

In an embodiment, the plurality of semiconductor chips 110 may be stacked in a stepped manner, and may be stacked while repeatedly changing a stepping direction thereof. That is, the plurality of semiconductor chips 110 may be stacked in a alternating or zigzag manner. For example, the second semiconductor chip 112 may be stacked in a manner ascending in a right direction with respect to the first semiconductor chip 111, and the third semiconductor chip 113 may be stacked in a manner ascending in a left direction with respect to the second semiconductor chip 112. The fourth semiconductor chip 114 may be stacked in a manner ascending in a right direction with respect to the third semiconductor chip 113. The first semiconductor chip 111 and the third semiconductor chip 113 may be vertically completely overlapped or aligned with each other, and the second semiconductor chip 112 and the fourth semiconductor chip 114 may be vertically completely overlapped or aligned with each other.

The plurality of die attach patterns 210_3 may have characteristics identical or similar to those of the die attach patterns 210 described with reference to FIG. 1. For example, each of the second to fourth die attach patterns 212_3, 213_3 and 214_3 disposed between vertically adjacent ones of the semiconductor chips 110 may expose a portion of an upper surface of a corresponding one of the first to third semiconductor chip 111, 112 and 113 disposed just thereunder. Each of the second to fourth die attach patterns 212_3, 213_3 and 214_3 may expose a portion adjacent to an edge opposite to an edge, to which a pad PD is adjacent, from among portions of the upper surface of the corresponding one of the first to third semiconductor chips 111, 112 and 113 disposed just thereunder.

In an embodiment, a recess R may be formed by a side surface of each die attach pattern 210_3, a front surface of the semiconductor chip 110 disposed just under the die attach pattern 210_3 and a back surface of the semiconductor chip 110 disposed just above or over the die attach pattern 210_3.

FIG. 27 is a sectional view of a semiconductor package according to an example embodiment of the disclosure.

Referring to FIG. 27, a semiconductor package 6 may include a substrate 10, a semiconductor chip 41 disposed on the substrate 10, an encapsulator 47, and a semiconductor stack SST6 disposed on the encapsulator 47.

The semiconductor chip 41 may be attached to an upper surface of the substrate 10 using an adhesive member 42. The semiconductor chip 41 may include an integrated circuit. For example, the semiconductor chip 41 may be a logic chip including a logic circuit. The logic chip may be a controller configured to control memory chips. In an embodiment, the semiconductor chip 41 may be wire-bonded to the substrate 10 through a wire 43.

The encapsulator 47 may cover the semiconductor chip 41. The encapsulator 47 may completely cover a side surface and an upper surface of the semiconductor chip 41. An upper surface of the encapsulator 47 may be disposed at a higher level than an upper surface of the semiconductor chip 41. For example, the encapsulator 47 may be an adhesive film such as a direct adhesive film (DAF). In an embodiment, the encapsulator 47 may include a molding compound.

The semiconductor stack SST6 may be attached to the upper surface of the encapsulator 47. The semiconductor stack SST6 may include a plurality of semiconductor chips 100 and a plurality of die attach patterns 210. The semiconductor chips 100 may be stacked through the die attach patterns 210. The semiconductor stack SST6 may have the same characteristics as the semiconductor stack SST1 described with reference to FIG. 1, except that the semiconductor stack SST6 is disposed on the encapsulator 47. In an embodiment, the semiconductor stack SST6 may have the same characteristics as the semiconductor stack SST2 or SST3 described with reference to FIG. 3 or 5, except that the semiconductor stack SST6 is disposed on the encapsulator 47.

In accordance with the example embodiments of the disclosure, a semiconductor package, in which portions of back surfaces of semiconductor chips are exposed by die attach patterns, may be provided and, as such, it may be possible to prevent attachment of wires to the die attach patterns.

In accordance with the example embodiments of the disclosure, an opening may be previously formed at a die attach film to be attached to a wafer and, as such, a procedure for exposing back surfaces of a plurality of semiconductor chips may be simplified.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method for manufacturing a semiconductor package, comprising:
   providing a multilayer adhesive film;
   forming a notch and a plurality of openings extending through the multilayer adhesive film;
   attaching the multilayer adhesive film to a back side of a wafer to form a stack;
   separating the stack into a plurality of individual stacks;
   separating each of the plurality of individual stacks into an upper stack and a lower stack;
   providing a substrate on which a first semiconductor chip is mounted; and
   stacking the upper stack on the first semiconductor chip, wherein the upper stack comprises a second semiconductor chip and a die attach pattern covering a portion of a back surface of the second semiconductor chip, and
   wherein a first side surface of the die attach pattern is aligned with a first side surface of the first semiconductor chip.

2. The method according to claim 1, wherein the multilayer adhesive film comprises:
   a die attach film;
   a cover layer covering a lower surface of the die attach film;
   a photosensitive adhesive (PSA) layer covering an upper surface of the die attach film; and
   a base layer covering an upper surface of the PSA layer.

3. The method according to claim 2, wherein the forming the stack comprises:

removing the cover layer from the multilayer adhesive film to expose the lower surface of the die attach film; and attaching the lower surface of the die attach film to the back side of the wafer.

4. The method according to claim 1, wherein forming the stack comprises:
aligning the notch with a notch of the wafer.

5. The method according to claim 1, wherein the separating the stack into the plurality of individual stacks comprises:
cutting the stack along a sawing line,
wherein the sawing line is vertically aligned with a side surface of the plurality of openings.

6. The method according to claim 1, wherein:
the separating the stack into the plurality of individual stacks comprises
separating the wafer into a plurality of semiconductor chips each corresponding to the second semiconductor chip; and
separating the multilayer adhesive film into a plurality of individual films, and
each of the individual films comprises the die attach pattern, a photosensitive adhesive (PSA) pattern on the die attach pattern, and a base pattern on the PSA pattern.

7. The method according to claim 6, wherein the separating each of the plurality of individual stacks into the upper stack and the lower stack comprises:
irradiating the PSA pattern with ultraviolet (UV) rays to decrease adhesion of the PSA pattern to the die attach pattern.

8. The method according to claim 6, wherein the separating each of the plurality of individual stacks into the upper stack and the lower stack comprises:
separating the die attach pattern and the PSA pattern from each other.

9. The method according to claim 8, wherein:
the back surface of the second semiconductor chip comprises a first portion contacting the die attach pattern, and a second portion exposed by the die attach pattern; and
a width of the second portion is substantially equal to a width of each of the plurality of openings.

10. The method according to claim 9, wherein the width of the second portion is 1 to 10% of a width of the second semiconductor chip.

11. The method according to claim 1, wherein each of the plurality of openings has a bar shape.

12. The method according to claim 1, wherein the plurality of openings are parallel to one another.

13. The method according to claim 1, wherein each of the plurality of openings has an equal width.

14. The method according to claim 1, wherein a width of each of the plurality of openings is about 200 to 800 μm.

15. The method according to claim 1, wherein some of the plurality of openings have the same length.

16. The method according to claim 1, wherein some of the plurality of openings have different lengths.

17. A method for manufacturing a semiconductor package, comprising:
providing a wafer comprising a front surface comprising a circuit layer and a back surface opposite the front surface;
forming a protective film on the front surface of the wafer;
providing a multilayer adhesive film comprising a die attach film;
forming a plurality of elongated openings extending through the multilayer adhesive film;
removing the protective film to expose the front surface of the wafer;
attaching the die attach film to the back surface of the wafer to form a stack;
separating the stack into a plurality of individual stacks;
separating each of the plurality of individual stacks into an upper stack and a lower stack, the upper stack comprising a first semiconductor chip and a die attach pattern covering a portion of a back surface of the first semiconductor chip;
providing a substrate on which a second semiconductor chip is mounted; and
stacking the upper stack on the second semiconductor chip,
wherein a first side surface of the die attach pattern is vertically misaligned from a first side surface of the first semiconductor chip while being vertically misaligned from a first side surface of the second semiconductor chip, and the first side surfaces of the first semiconductor chip and the second semiconductor chip are disposed adjacent the first side surface of the die attach pattern.

18. The method according to claim 17, further comprising:
forming a notch extending through the multilayer adhesive film.

19. The method according to claim 18, wherein the forming the stack comprises:
aligning the notch with a notch of the wafer.

20. A method for manufacturing a semiconductor package, comprising:
providing a wafer comprising a front surface comprising a scribe lane and a back surface opposite the front surface;
forming a protective film on the front surface of the wafer;
providing a multilayer adhesive film comprising a die attach film, a cover layer covering a lower surface of the die attach film, a photosensitive adhesive (PSA) layer covering an upper surface of the die attach film, and a base layer covering an upper surface of the PSA layer;
forming a notch and a plurality of bar-shaped openings extending through the multilayer adhesive film;
removing the protective film to expose the front surface of the wafer;
removing the cover layer from the multilayer adhesive film, and attaching the die attach film to the back surface of the wafer to form a stack;
separating the stack into a plurality of individual stacks;
separating each of the plurality of individual stacks into an upper stack and a lower stack, the upper stack comprising a semiconductor chip and a die attach pattern covering a portion of a back surface of the semiconductor chip; and
stacking the upper stack on a substrate,
wherein, in the stack, the openings are vertically aligned with portions of the scribe lane, and
wherein a width of each of the openings is 1 to 10% of a width of the semiconductor chip.

* * * * *